(12) United States Patent
Uehara et al.

(10) Patent No.: US 9,232,634 B2
(45) Date of Patent: Jan. 5, 2016

(54) FLEXIBLE CIRCUIT BOARD FOR MOUNTING LIGHT EMITTING ELEMENT, ILLUMINATION APPARATUS, AND VEHICLE LIGHTING APPARATUS

(71) Applicant: CANON COMPONENTS, INC., Kodama-gun, Saitama (JP)

(72) Inventors: Hiroharu Uehara, Saitama (JP); Katsuhide Nakai, Saitama (JP); Hiroki Shirato, Saitama (JP)

(73) Assignee: CANON COMPONENTS, INC. (JP)

( * ) Notice: Subject to any disclaimer, the term of this patent is extended or adjusted under 35 U.S.C. 154(b) by 153 days.

(21) Appl. No.: 13/934,807

(22) Filed: Jul. 3, 2013

(65) Prior Publication Data
US 2014/0020935 A1    Jan. 23, 2014

Related U.S. Application Data

(63) Continuation-in-part of application No. 13/351,323, filed on Jan. 17, 2012, now Pat. No. 8,963,012, and a continuation-in-part of application No. 13/734,089, filed on Jan. 4, 2013.

(30) Foreign Application Priority Data

Jan. 17, 2011  (JP) .................................. 2011-007362
Jan. 5, 2012   (JP) .................................. 2012-000748
Oct. 25, 2012  (JP) .................................. 2012-236025

(51) Int. Cl.
*H05K 1/02* (2006.01)
*H05K 1/18* (2006.01)
(Continued)

(52) U.S. Cl.
CPC ............. *H05K 1/0277* (2013.01); *H05K 1/056* (2013.01); *H05K 1/189* (2013.01); *H05K 1/181* (2013.01); *H05K 3/4092* (2013.01); *H05K 2203/1545* (2013.01)

(58) Field of Classification Search
CPC .............................. H05K 1/0277; H05K 1/181
USPC ..................................................... 174/254, 260
See application file for complete search history.

(56) References Cited

U.S. PATENT DOCUMENTS 6,452,117 B2   9/2002  Curcio et al.
7,391,153 B2   6/2008  Suehiro et al.
(Continued)

FOREIGN PATENT DOCUMENTS

JP    60-119769    8/1985
JP    02039448 A   2/1990
(Continued)

OTHER PUBLICATIONS

Official Action issued in JP2013-109794 mailed Sep. 16, 2014.
(Continued)

*Primary Examiner* — Timothy Thompson
*Assistant Examiner* — Charles Pizzuto
(74) *Attorney, Agent, or Firm* — Rossi, Kimms & McDowell LLP

(57) ABSTRACT

A flexible circuit board 3a for mounting a light emitting element has base films 31a and 31b, a wiring pattern 32 formed on a surface of the base films 31a and 31b, and the cover films 33a and 33b that covers the base films 31a and 31b and the wiring pattern 32. At least one of the base film and the cover films 33a and 33b have a substrate 331 and 331a comprising a metal. The cover film 33a and 33b have such surface properties as to produce specular reflection or diffuse reflection of light or has substantially white reflecting films 36 and 333 on a surface of the cover film.

15 Claims, 26 Drawing Sheets

(51) Int. Cl.
*H05K 1/05* (2006.01)
*H05K 3/40* (2006.01)

(56) References Cited

U.S. PATENT DOCUMENTS

| | | |
|---|---|---|
| 7,755,715 B2 | 7/2010 | Kimura et al. |
| 7,960,747 B2 | 6/2011 | Sakamoto et al. |
| 9,089,050 B2 | 7/2015 | Kajiya |
| 2004/0061240 A1 | 4/2004 | Seko |
| 2004/0221447 A1 | 11/2004 | Ishii et al. |
| 2005/0116235 A1 | 6/2005 | Schultz et al. |
| 2007/0088134 A1 | 4/2007 | Suzuki et al. |
| 2007/0177380 A1 | 8/2007 | Schultz et al. |
| 2009/0007421 A1 | 1/2009 | Chen et al. |
| 2009/0032829 A1 | 2/2009 | Chew et al. |
| 2009/0194319 A1 | 8/2009 | Itoh et al. |
| 2009/0203165 A1 | 8/2009 | Pinarbasi et al. |
| 2010/0151116 A1 | 6/2010 | Takahashi et al. |
| 2011/0051044 A1 | 3/2011 | Segawa |
| 2011/0075374 A1 | 3/2011 | Kang et al. |
| 2011/0309381 A1 | 12/2011 | Betsuda et al. |
| 2012/0138997 A1 | 6/2012 | Tasaki et al. |
| 2012/0147592 A1 | 6/2012 | Takase |
| 2012/0186858 A1 | 7/2012 | Uehara et al. |
| 2013/0092421 A1* | 4/2013 | Kajiya .................. 174/252 |
| 2013/0176739 A1* | 7/2013 | Uehara ................. 362/296.01 |

FOREIGN PATENT DOCUMENTS

| | | |
|---|---|---|
| JP | 05-029395 A | 2/1993 |
| JP | 08153940 A | 6/1996 |
| JP | 09064108 A | 3/1997 |
| JP | 2000340019 A | 12/2000 |
| JP | 2004029448 A | 1/2004 |
| JP | 2004079594 A | 3/2004 |
| JP | 2004335700 A | 11/2004 |
| JP | 2005-070240 A | 3/2005 |
| JP | 2005-123477 A | 5/2005 |
| JP | 2005-136224 A | 5/2005 |
| JP | 2005-166780 A | 6/2005 |
| JP | 2005-283852 A | 10/2005 |
| JP | 2006-286702 A | 10/2006 |
| JP | 2007-018926 A | 1/2007 |
| JP | 2007-513520 A | 5/2007 |
| JP | 2007-189261 A | 7/2007 |
| JP | 2007-200869 A | 8/2007 |
| JP | 2007-208221 A | 8/2007 |
| JP | 2007-273972 A | 10/2007 |
| JP | 2007258197 A | 10/2007 |
| JP | 2008-141073 A | 6/2008 |
| JP | 2008-187030 A | 8/2008 |
| JP | 2008-244285 A | 10/2008 |
| JP | 2009-025679 A | 2/2009 |
| JP | 2009081004 A | 4/2009 |
| JP | 2009-111180 A | 5/2009 |
| JP | 2009-129801 A | 6/2009 |
| JP | 2009-188187 A | 8/2009 |
| JP | 2009-231584 A | 10/2009 |
| JP | 4340272 B2 | 10/2009 |
| JP | 2009272451 A | 11/2009 |
| JP | 2007-110010 A | 12/2009 |
| JP | 2009-302110 A | 12/2009 |
| JP | 2010-189614 A | 9/2010 |
| JP | 2010-232252 A | 10/2010 |
| JP | 201153543 A | 3/2011 |
| JP | 2011-126262 A | 6/2011 |
| JP | 2011249574 A | 12/2011 |
| JP | 2012-151192 A | 8/2012 |
| WO | 2009047891 A1 | 4/2009 |
| WO | 2011027588 A1 | 3/2011 |
| WO | 2011/118108 A1 | 9/2011 |
| WO | 2011/118109 A1 | 9/2011 |
| WO | 2011118352 A1 | 9/2011 |

OTHER PUBLICATIONS

Trial Decision issued in JP2012-236025 mailed Oct. 21, 2014.
Partial European Search Report issued in EP13150214 mailed Nov. 20, 2014.
Japanese Office Action for JP 2013-109794, mail date Oct. 8, 2013. Cited in related U.S. Appl. No. 13/734,089.
Court Hearing for JP 2012-236025, mail date Nov. 12, 2013. Cited in related U.S. Appl. No. 13/734,089.
Office Action issued in Japanese Patent Application No. 2011-007362 dated Jan. 29, 2013.Cited in related U.S. Appl. No. 13/351,323, filed Jan. 7, 2012.
Japanese Office Action for JP 2012-236025, mail date Jul. 9, 2013. Cited in related U.S. Appl. No. 13/734,089.
Japanese Office Action cited in Japanese application No. JP2013-098507, dated Jan. 6, 2015. (Cover page in English).
Japanese Office Action issued in JP2013-109794, dated Feb. 3, 2015.
JP 2011-249574 English Translation cited in copending U.S. Appl. No. 13/734,089, dated May 4, 2015.
Non-Final Office Action issued in copending U.S. Appl. No. 13/734,089, dated May 4, 2015.
Office Action issued in Japanese Patent Application No. 2011-007362 dated Jan. 29, 2013. Cited in related U.S. Appl. No. 13/351,323, filed Jan. 7, 2012.
Japanese Office Action issued Mar. 26, 2013 for JP 2012-236025 cited in related U.S. Appl. No. 13/734,089, filed Jan. 4, 2012.
Office Action issued in CN201310001279.0, mailed Aug. 5, 2015. English translation provided.
Office Action issued in U.S. Appl No. 13/734,089, mailed Oct. 30, 2015.
Office Action issued in JP2013-098507, mailed Nov. 10, 2015.

* cited by examiner

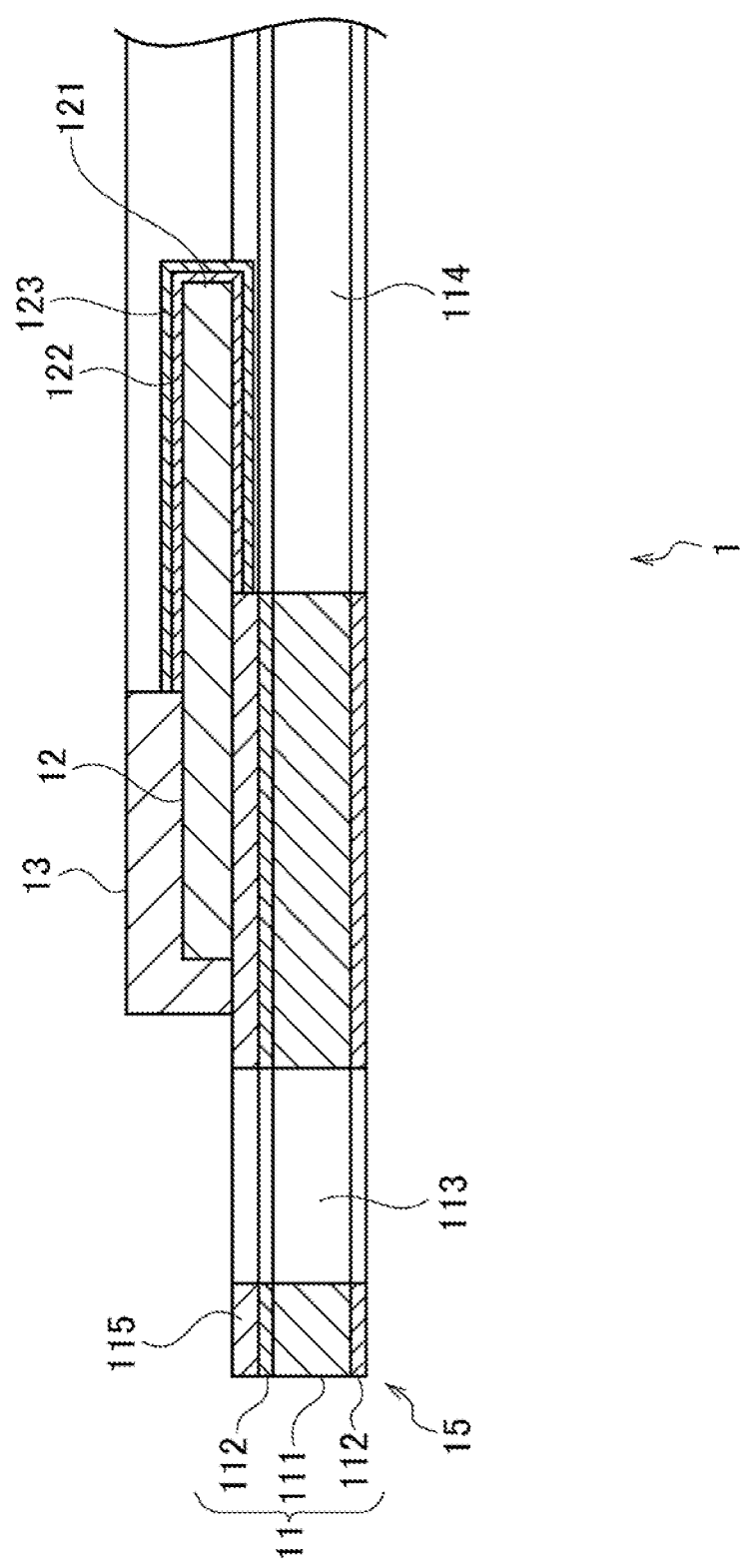

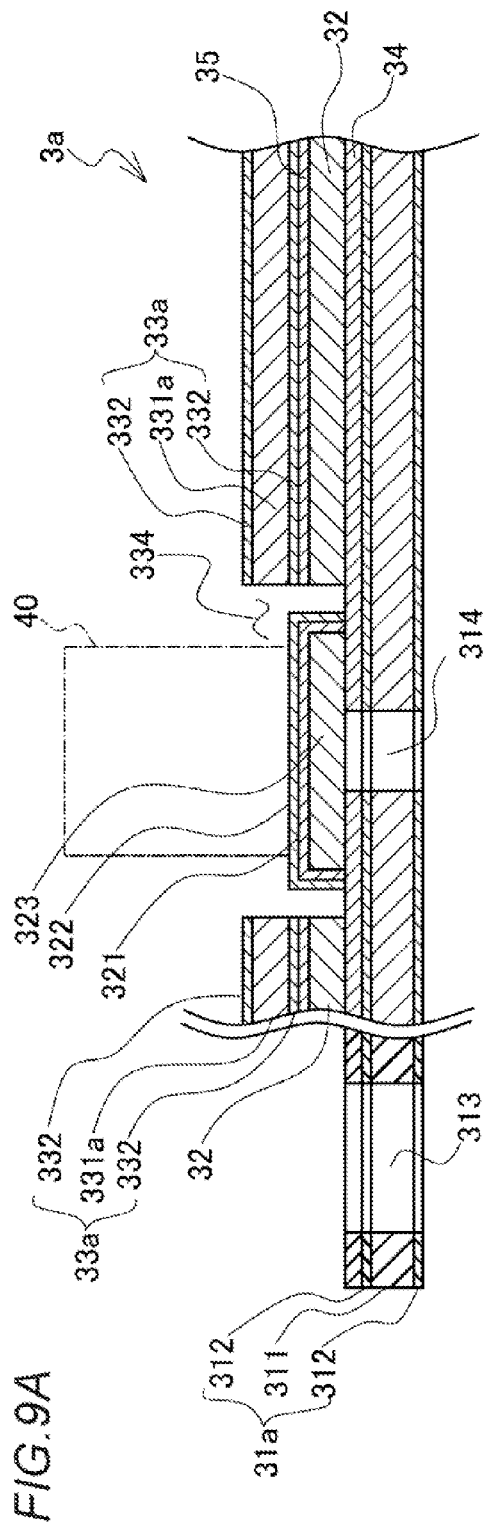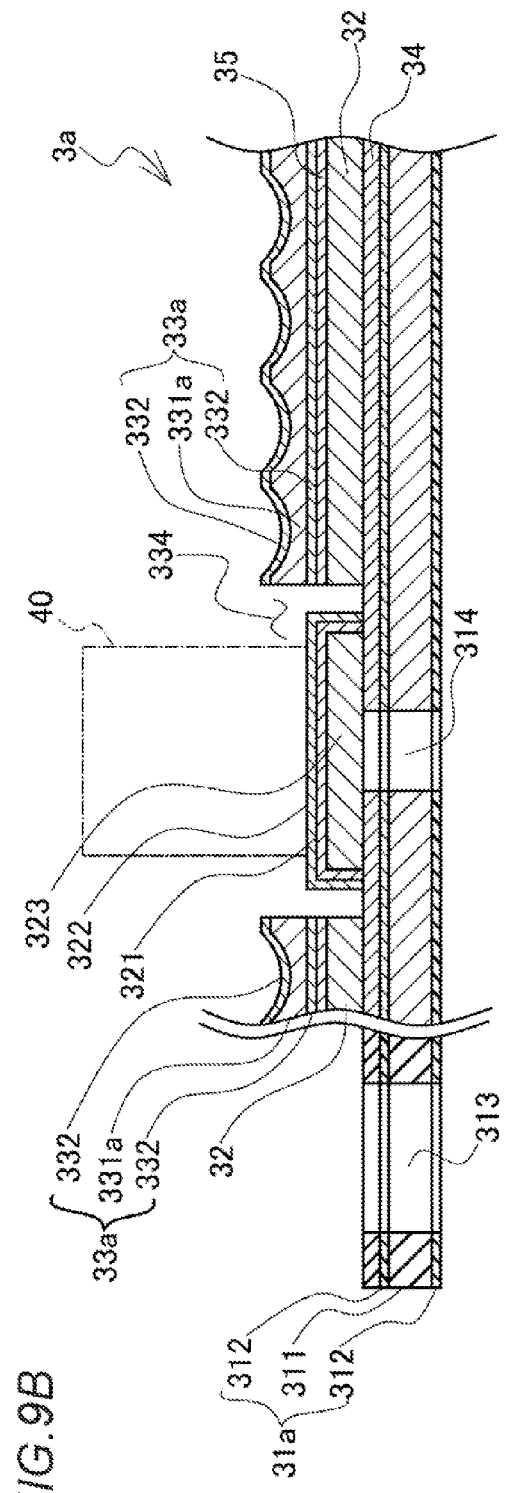

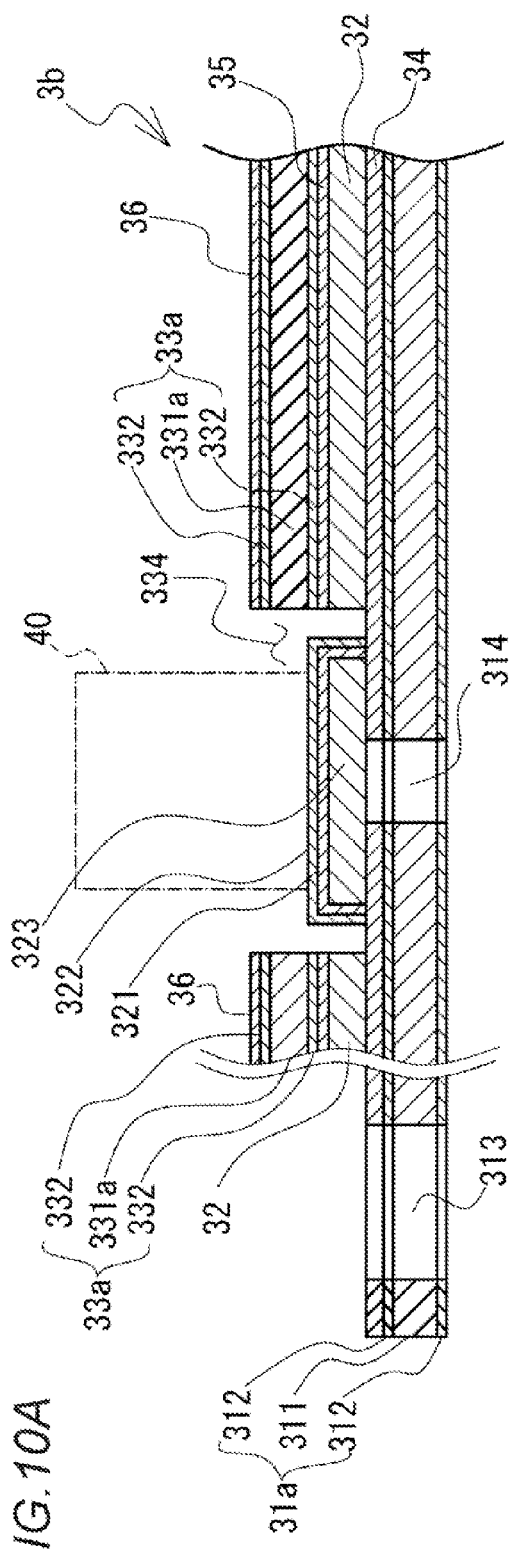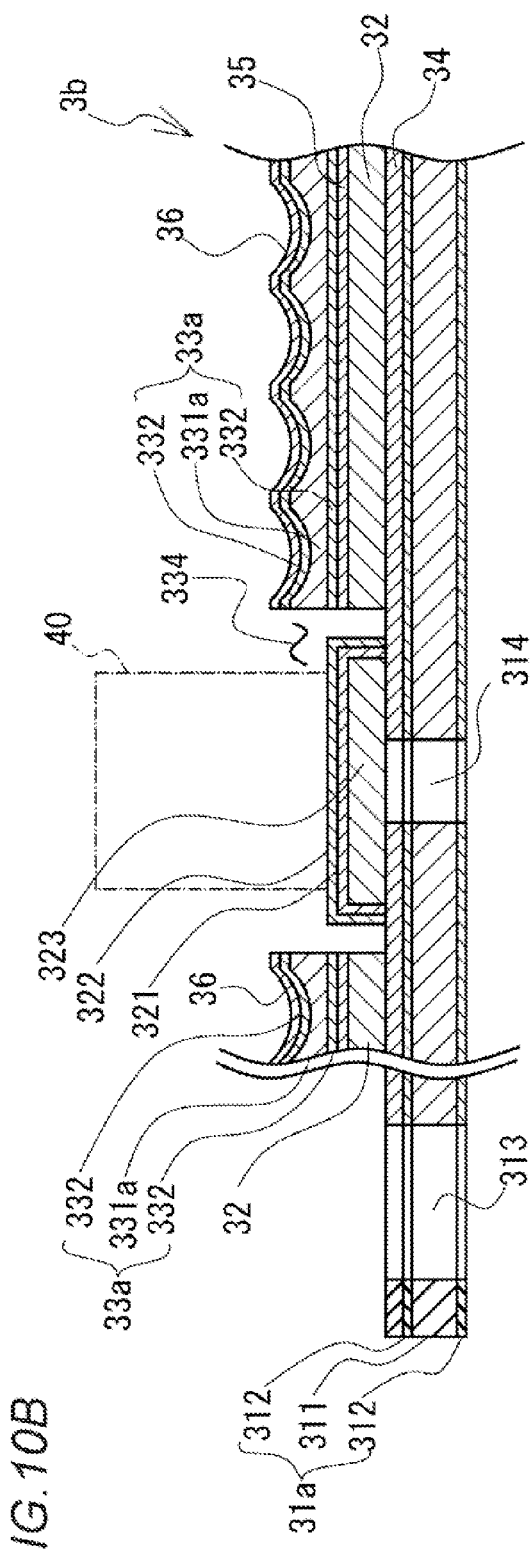

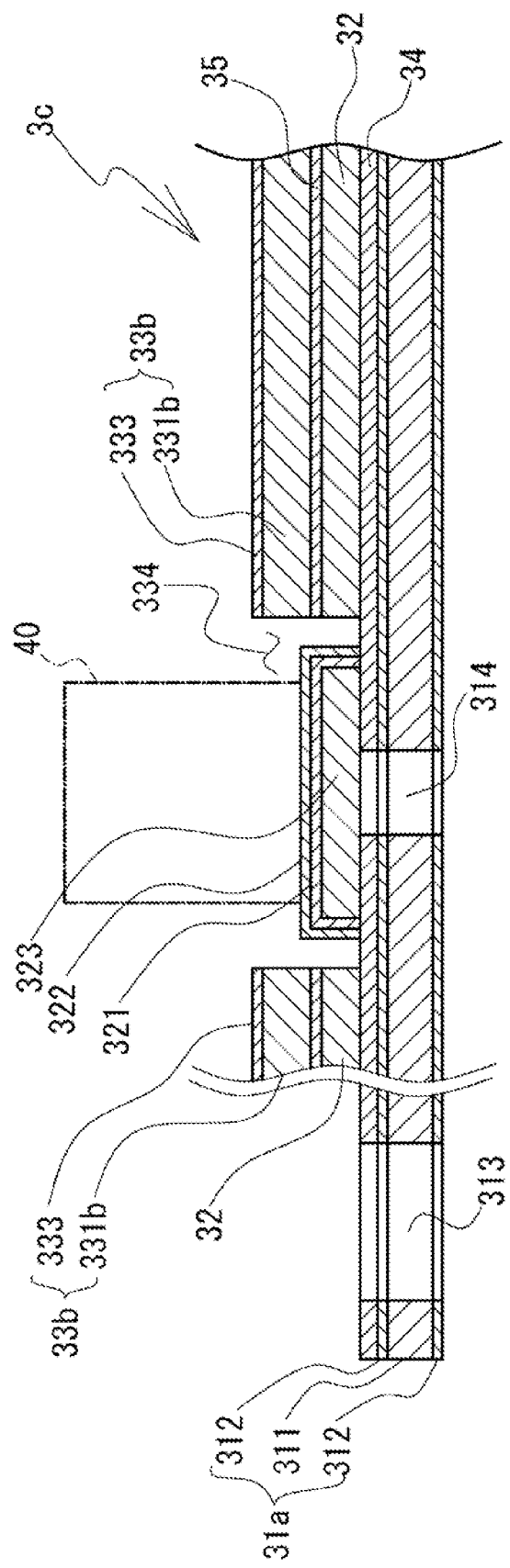

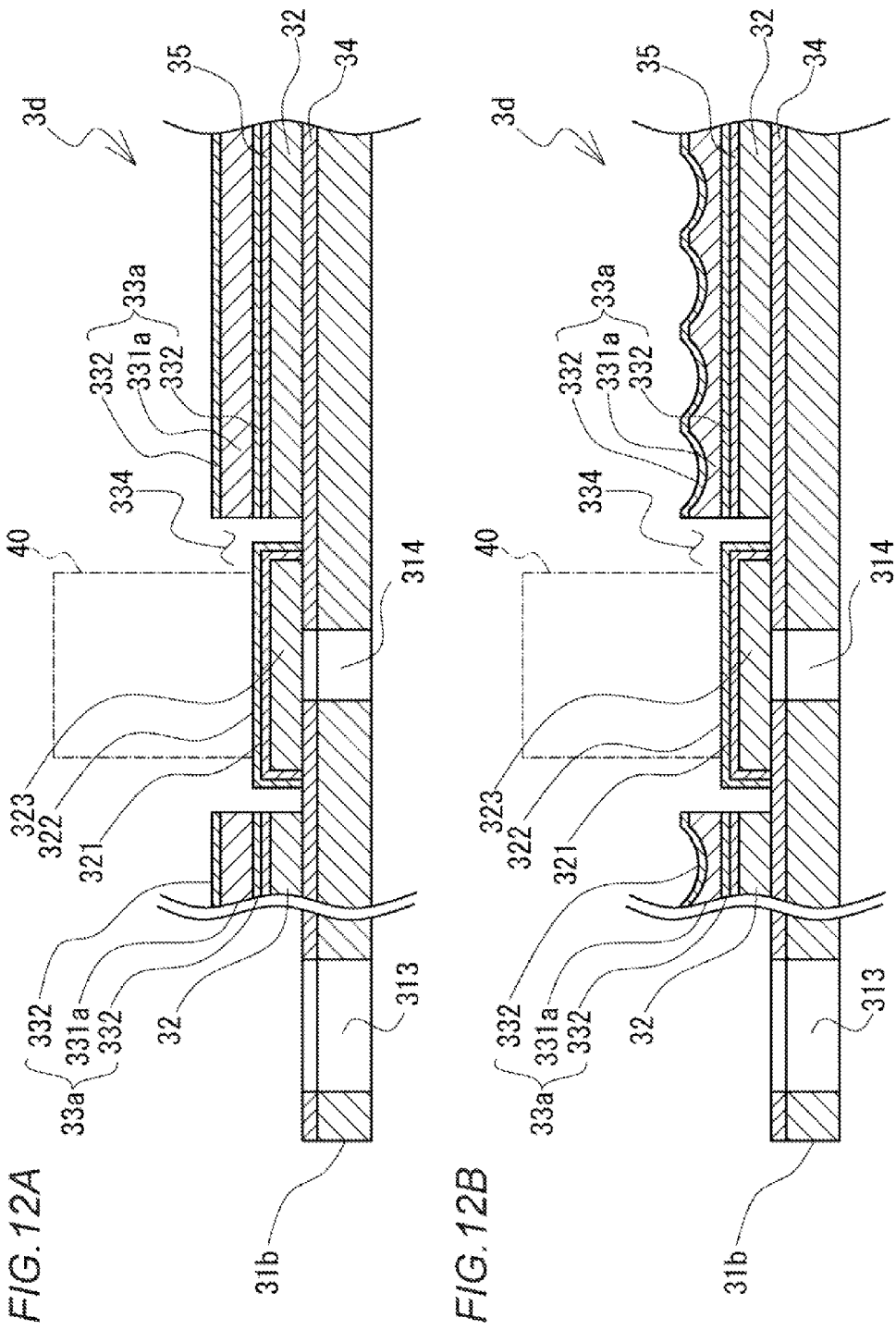

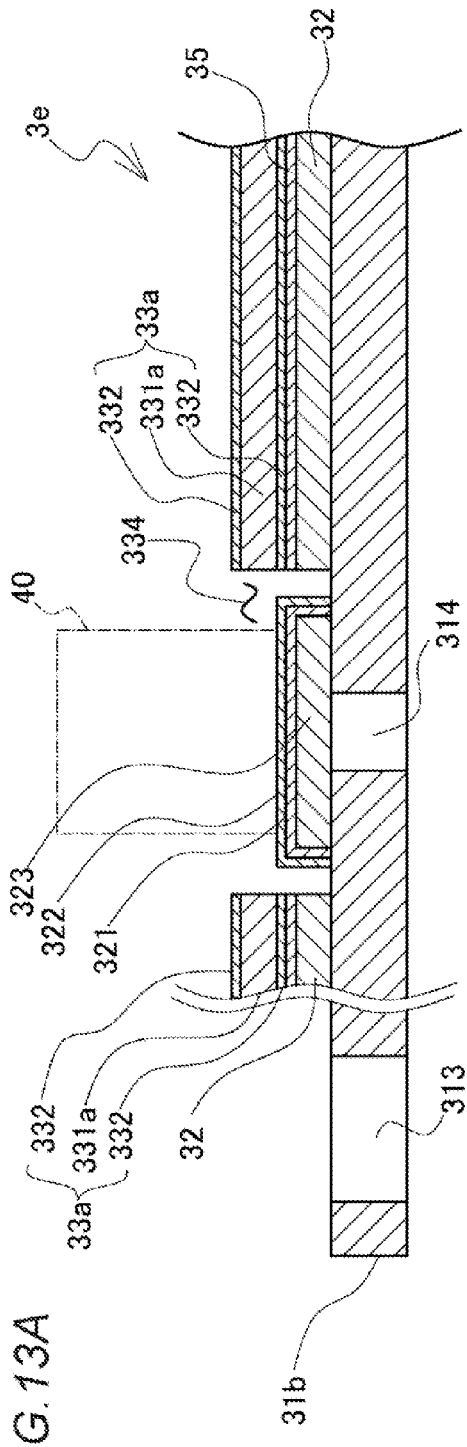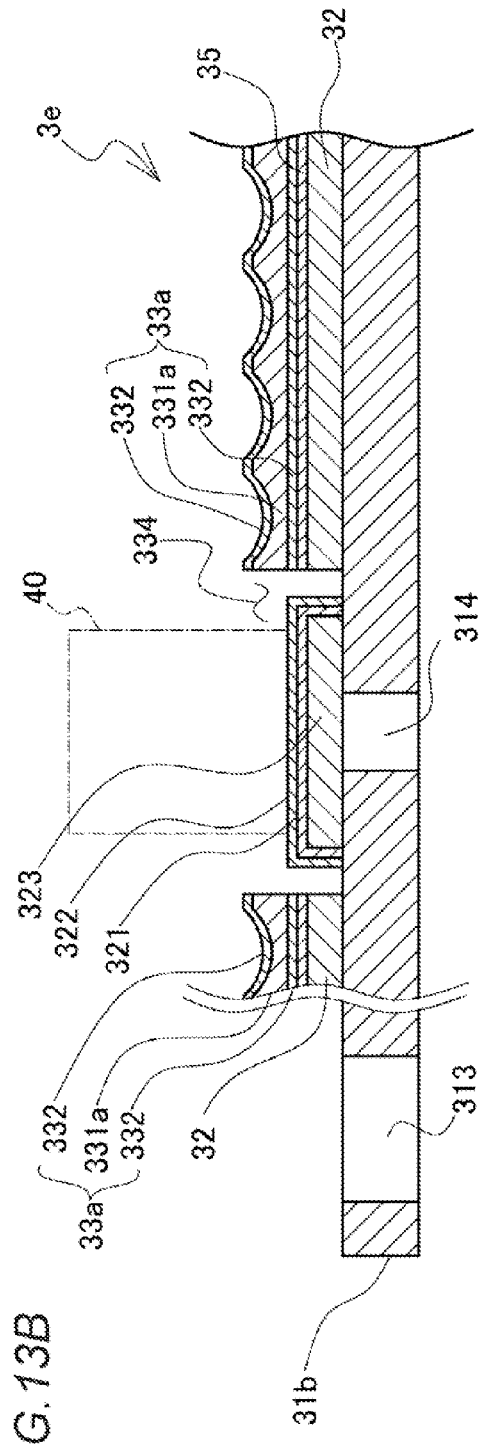

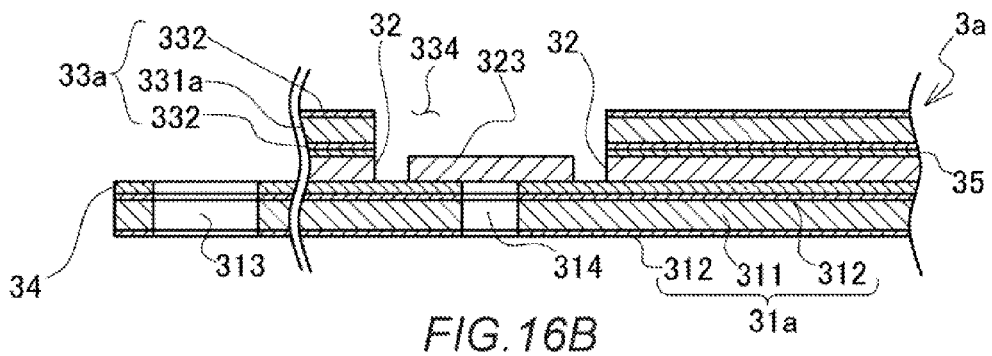
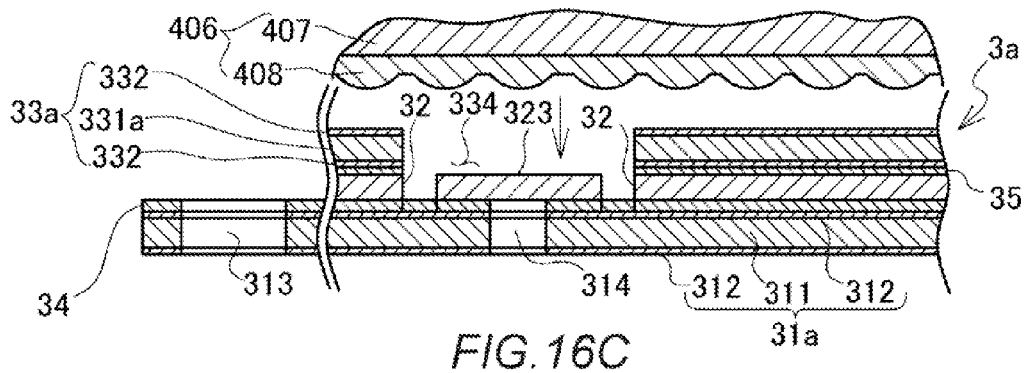
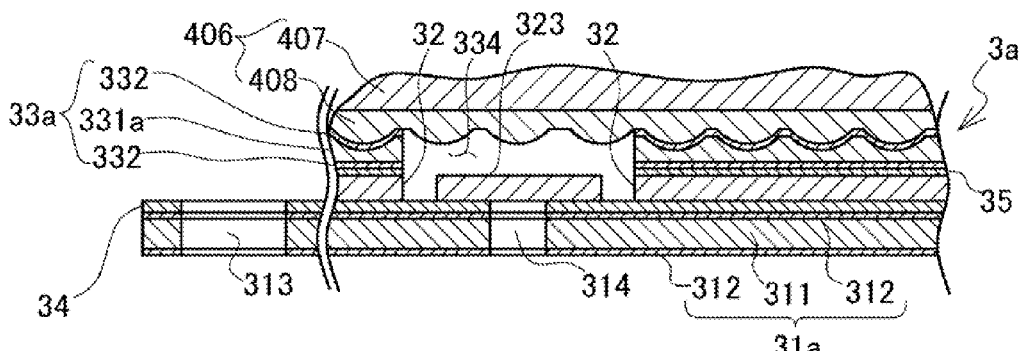
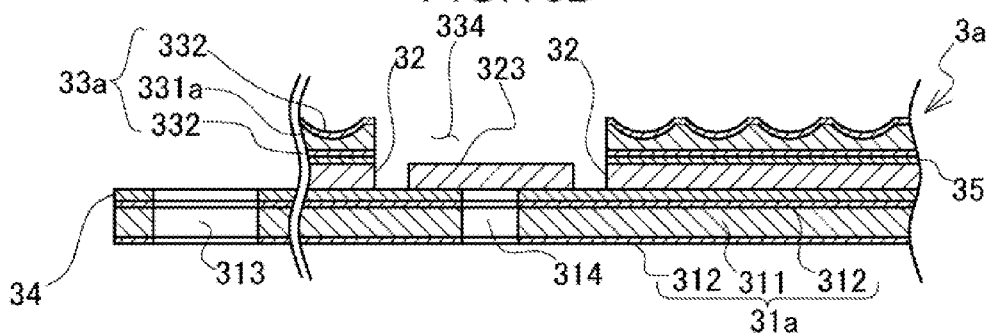

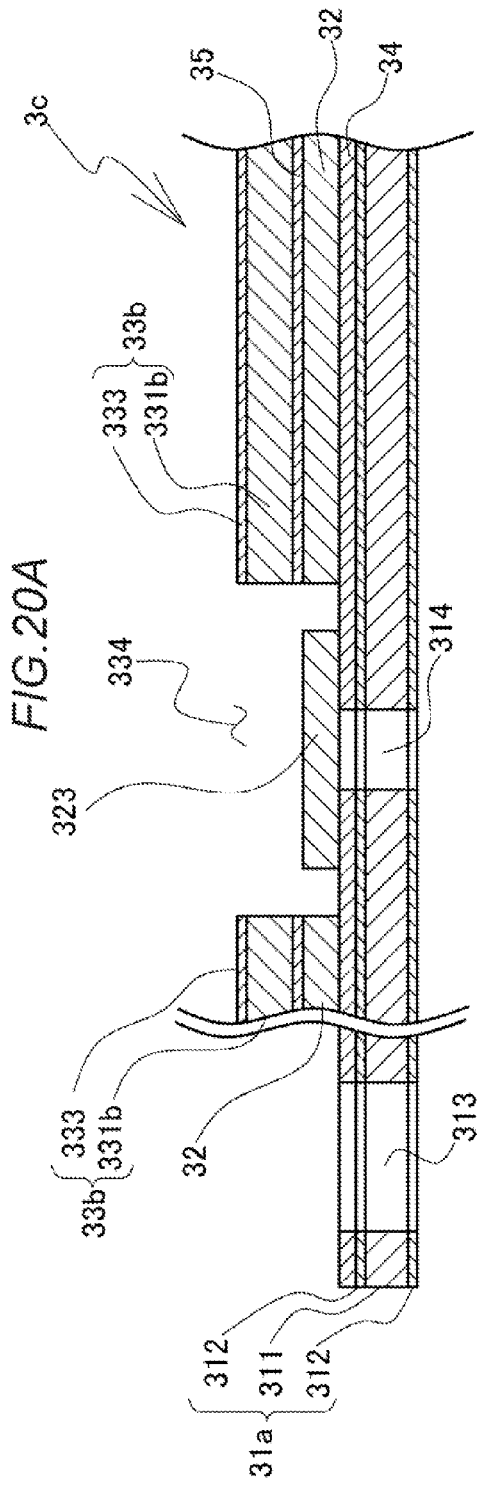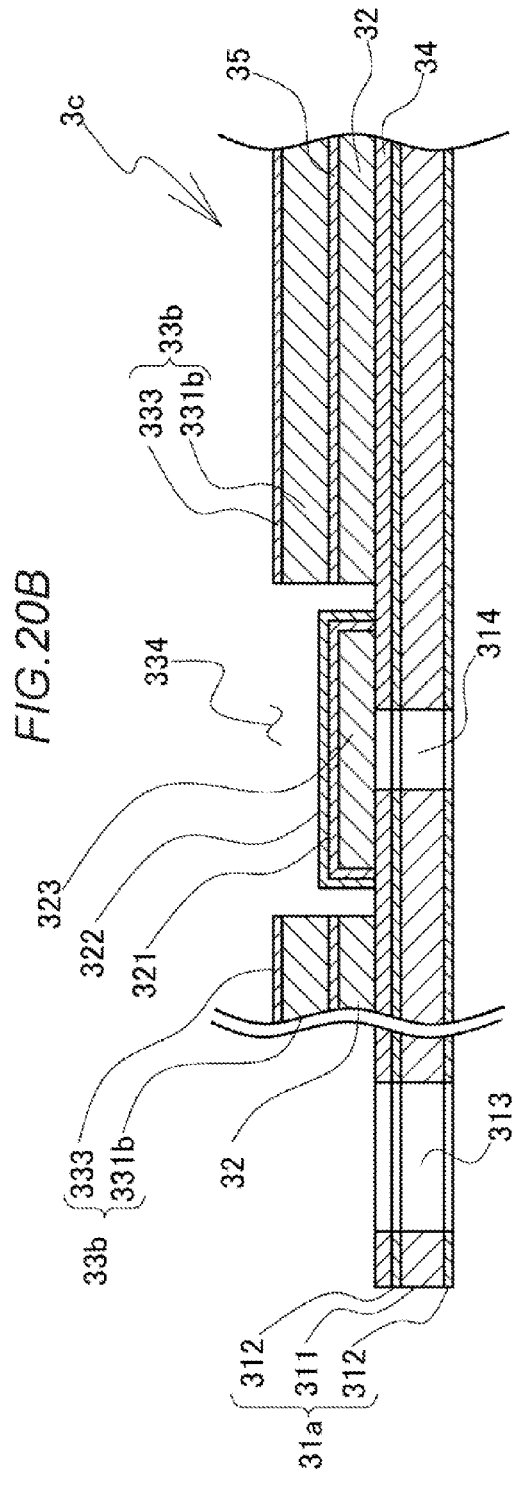

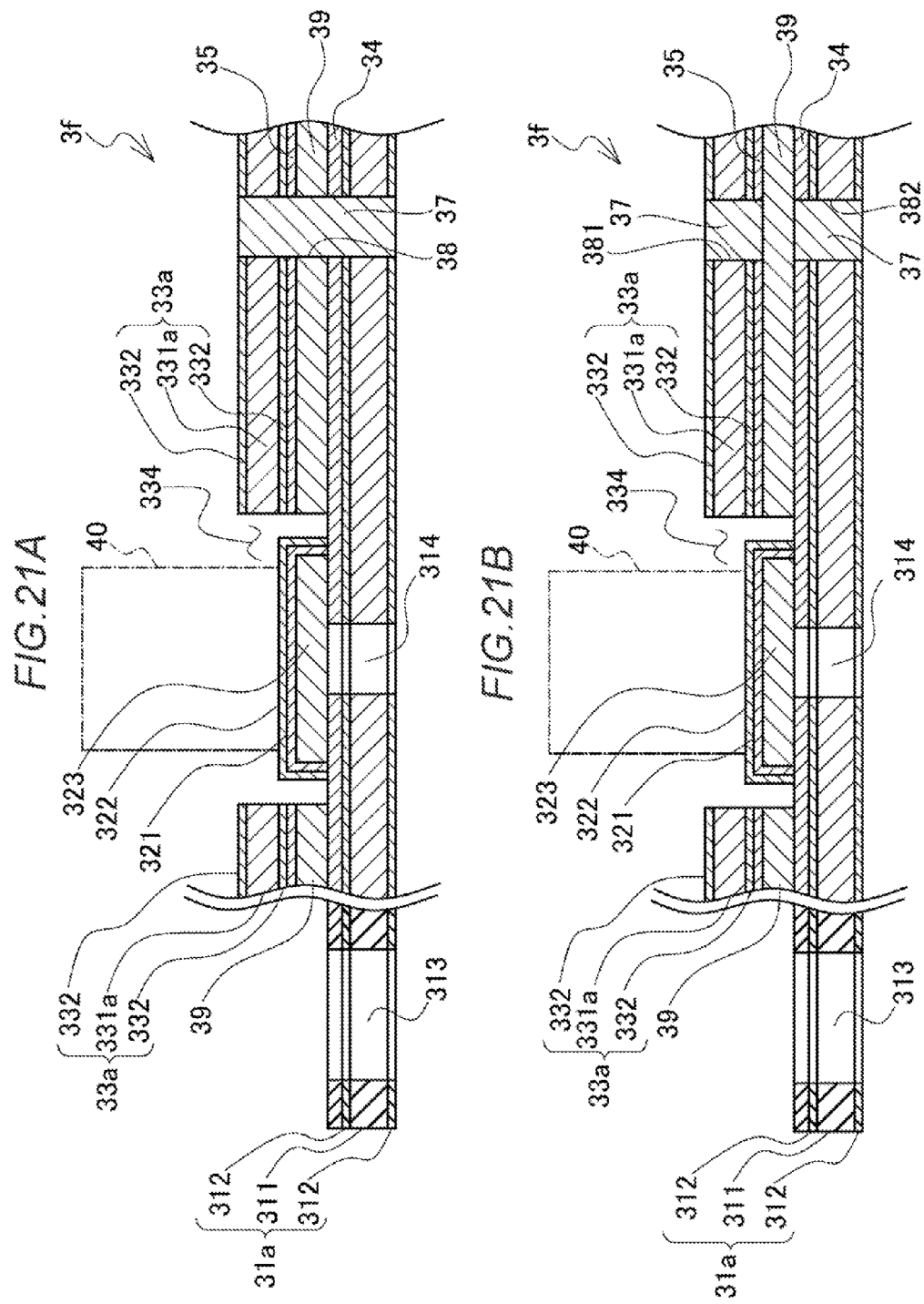

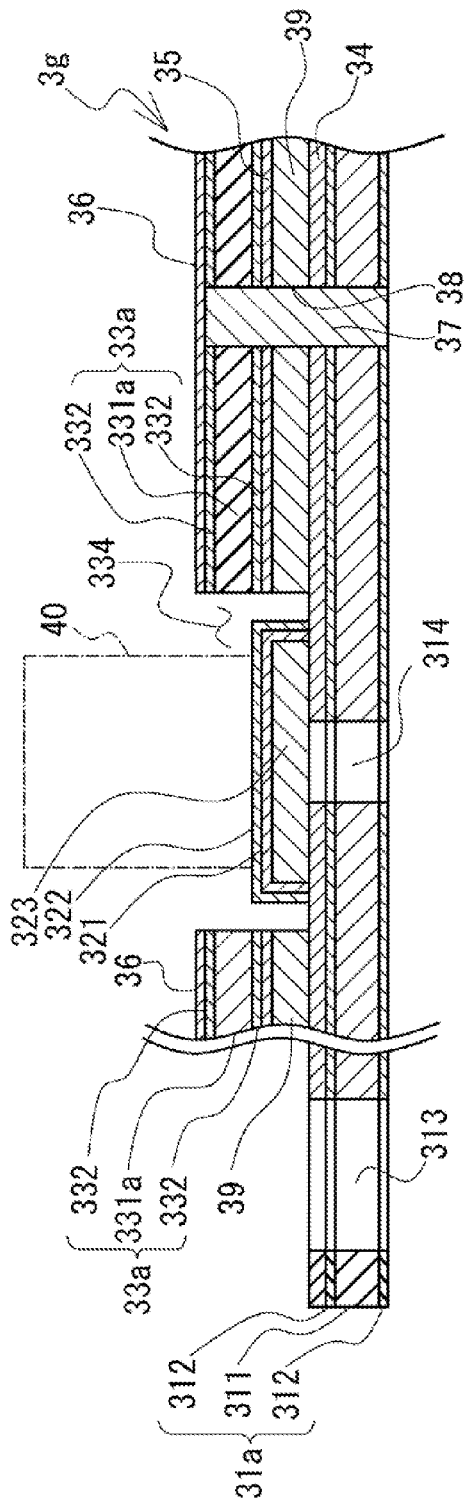
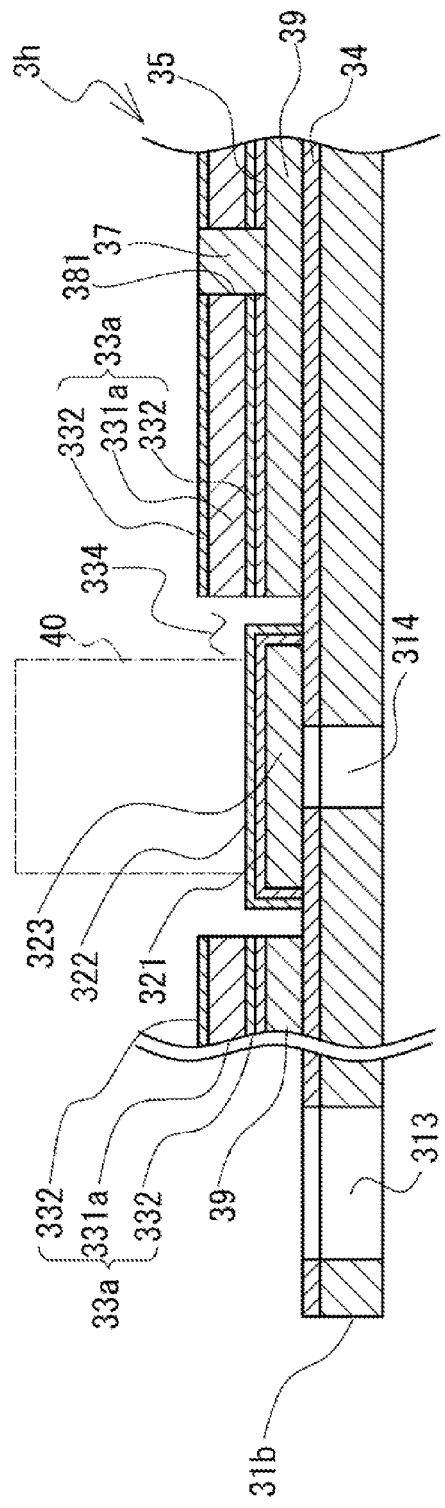

FLEXIBLE CIRCUIT BOARD FOR MOUNTING LIGHT EMITTING ELEMENT, ILLUMINATION APPARATUS, AND VEHICLE LIGHTING APPARATUS

CROSS-REFERENCE TO RELATED APPLICATIONS

This is a continuation-in-part application of the U.S. application Ser. No. 13/351,323, filed on Jan. 17, 2012, and U.S. application Ser. No. 13/734,089, filed on Jan. 4, 2013.

This application is based upon and claims the benefit of priority of the prior Japanese Patent Application No. 2011-007362, filed on Jan. 17, 2011, the Japanese Patent Application No. 2012-000748, filed on Jan. 5, 2012, and the Japanese Patent Application No. 2012-236025, filed on Oct. 25, 2012, the entire contents of which are incorporated herein by reference.

BACKGROUND OF THE INVENTION

1. Field of the Invention

The present invention relates to a flexible circuit board for mounting a light emitting element, an illumination apparatus, and a vehicle lighting apparatus. In particular, the present invention relates to a flexible circuit board for mounting a light emitting element that allows radiation of heat generated by a light emitting element, such as an LED, and efficient use of light emitted by the light emitting element, and an illumination apparatus and a vehicle lighting apparatus incorporating the same.

2. Description of the Related Art

A resin composition of, e.g., polyimide (PI), polyethylene terephthalate (PET), or polyethylene naphthalate (PEN) is generally used as the material for abase film of a flexible circuit board (FPC) (see Patent Documents 1 and 2). For example, Patent Document 2 discloses a configuration which uses polyimide or polyethylene terephthalate as the material for a base film of a flexible circuit board.

However, a configuration using a film of a resin composition as a base film of a flexible circuit board may suffer from the problems below.

Resin compositions as described above are expensive, which makes it difficult to reduce the price of a flexible circuit board.

Examples of a flexible circuit board include a carrier tape for TAB (Tape Automated Bonding). A carrier tape for TAB has a sprocket hole for positioning in bonding and a device hole for mounting a device, an electronic component, or the like. A sprocket hole and a device hole are openings extending through a base film in a thickness direction. Etching or die-punching is used to form such an opening. A process of forming an opening in a base film of a resin composition by etching is costly and is very low in processing rate. Die-punching requires facilities for punching, which increases facilities cost.

Flexible circuit boards have been increasing in width in order to, e.g., enhance production efficiency. However, a base film made of a resin composition is considerably deformed or varies widely in dimensions due to a temperature change, moisture absorption, or the like. For this reason, the yield of flexible circuit boards using a resin composition as the material for a base film tends to decrease with an increase in width.

In recent years, the density or the number of layers of wiring patterns to be formed at a flexible circuit board or devices or the like to be mounted on the flexible circuit board has been increasing. However, due to the low thermal conductivity of a resin composition, the higher density or the larger number of layers increases thermal load on a mounted device and the like. An increase in the density or the number of layers is thus hard to achieve.

The flexible circuit board configured as described above may pose the following problems when used as a substrate for mounting a light emitting element, such as a light emitting diode (LED). The LED used as a light emitting element deteriorates in characteristics at high temperatures and therefore needs to radiate heat in order to avoid becoming hot. In general, resin materials have low thermal conductivities, so that the flexible circuit board, whose base film and cover film are made of a resin material, may be unable to sufficiently radiate the heat generated by the LED. In addition, in order to efficiently use the light emitted by the LED, the amount of light absorbed by the surface of the flexible circuit board needs to be small. However, polyimide, which is used as the material of the base film and the cover film, is brown in color and therefore tends to absorb the light emitted by the LED, thereby reducing the amount of light available.

As a measure to radiate heat from a circuit board with an LED mounted thereon, for example, there is proposed an arrangement in which a metal radiator plate is disposed in close contact with the surface of the circuit board opposite to the surface on which the LED is mounted (see Patent Document 3). As another measure, there is proposed a flexible circuit board comprising a metal substrate and a wiring pattern formed on the metal substrate with an insulating film interposed therebetween (see Patent Document 4). As a measure to allow efficient use of light, an arrangement incorporating a cover film having a surface with a predetermined reflectance is proposed (see Patent Documents 4 and 5). However, the arrangement in which the radiator plate is mounted on the back surface leads to an increase in cost. Furthermore, none of the prior-art documents described above discloses an arrangement that achieves both radiation of the heat generated by the LED and efficient use of the light emitted by the LED.

Patent Document 1: Japanese Laid-open Patent Publication No. 05-029395

Patent Document 2: Japanese Laid-open Patent Publication No. 2007-18926

Patent Document 3: Japanese Laid-Open Patent Publication No. 2009-25679

Patent Document 4: Japanese Laid-Open Patent Publication No. 2007-110010

Patent Document 5: Japanese Laid-Open Patent Publication No. 2009-302110

Patent Document 6: Japanese Laid-Open Patent Publication No. 2010-232252

SUMMARY OF THE INVENTION

In view of the circumstances described above, an object of the present invention is to provide a flexible circuit board for mounting a light emitting element, such as an LED, that radiates heat generated by the light emitting element to prevent an increase of the temperature of the light emitting element and has a high surface reflectance to allow efficient use of light emitted by the light emitting element.

Another object is to provide a flexible circuit board for mounting a light emitting element that has a high electromagnetic shielding capability as well as heat dissipation properties and electric insulating properties and can be bent, and an illumination apparatus and a vehicle lighting apparatus incorporating the same.

To attain the objects described above, a flexible circuit board for mounting a light emitting element according to the present invention comprises a base film having a substrate made of a metal and insulating protective films disposed on opposite sides of the substrate, a wiring pattern formed on a surface of the base film, and a cover film that has such a surface property as to produce specular reflection or diffuse reflection of light and covers the wiring pattern.

Another flexible circuit board for mounting a light emitting element according to the present invention comprises a base film having a substrate made of a resin material, a wiring pattern formed on a surface of the base film, and a cover film that has a substrate made of a metal material, has such a surface property as to produce specular reflection or diffuse reflection of light and covers the wiring pattern.

A vehicle lighting apparatus according to the present invention comprises a flexible circuit board for mounting a light emitting element according to the present invention and a light emitting element mounted on the circuit board.

Furthermore, according to the present invention, since the flexible circuit board for mounting a light emitting element incorporates a base film having a substrate made of a metal material, deformation or a dimensional change caused by a temperature change or moisture absorption can be more effectively suppressed in the present invention than in a configuration using a film of a resin composition. Accordingly, an increase in the yield of products can be achieved. Also, since aluminum has higher thermal conductivity and higher thermal dissipation capability than a resin composition, thermal load on a component or a device to be mounted or the like can be reduced. The reduction in thermal load allows an increase in the number of layers of conductor patterns such as a circuit pattern and the density of components or devices to be mounted. Additionally, aluminum blocks electromagnetic waves, and effects of external electromagnetic waves or unwanted emissions (EMI) to the outside can be prevented or suppressed. Further, the price of the base film can be made lower than a configuration using a resin composition (e.g., polyimide). For this reason, a reduction in product price can be achieved.

BRIEF DESCRIPTION OF THE DRAWINGS

FIG. 2 is a cross-sectional view schematically showing the configuration of the flexible circuit board according to the first embodiment of the present invention;

FIG. 9A is a schematic cross-sectional view showing a configuration of a flexible circuit board for mounting a light emitting element according to a second embodiment of the present invention;

FIG. 9B is a schematic cross-sectional view showing a configuration of the flexible circuit board for mounting a light emitting element according to the second embodiment of the present invention;

FIG. 10A is a schematic cross-sectional view showing a configuration of a flexible circuit board for mounting a light emitting element according to a third embodiment of the present invention;

FIG. 10B is a schematic cross-sectional view showing a configuration of the flexible circuit board for mounting a light emitting element according to the third embodiment of the present invention;

FIG. 11 is a schematic cross-sectional view showing a configuration of a flexible circuit board for mounting a light emitting element according to a fourth embodiment of the present invention;

FIG. 12A is a schematic cross-sectional view showing a configuration of a flexible circuit board for mounting a light emitting element according to a fifth embodiment of the present invention;

FIG. 12B is a schematic cross-sectional view showing a configuration of the flexible circuit board for mounting a light emitting element according to the fifth embodiment of the present invention;

FIG. 13A is a schematic cross-sectional view showing a configuration of a flexible circuit board for mounting a light emitting element according to a sixth embodiment of the present invention;

FIG. 13B is a schematic cross-sectional view showing a configuration of the flexible circuit board for mounting a light emitting element according to the sixth embodiment of the present invention;

FIG. 16A is a schematic cross-sectional view for illustrating a step of forming a cover film in the method of manufacturing the flexible circuit board for mounting a light emitting element according to the second embodiment of the present invention;

FIG. 16B is a schematic cross-sectional view for illustrating a step of forming a cover film in the method of manufacturing the flexible circuit board for mounting a light emitting element according to the second embodiment of the present invention;

FIG. 16C is a schematic cross-sectional view for illustrating a step of forming a cover film in the method of manufacturing the flexible circuit board for mounting a light emitting element according to the second embodiment of the present invention;

FIG. 16D is a schematic cross-sectional view for illustrating a step of forming a cover film in the method of manufacturing the flexible circuit board for mounting a light emitting element according to the second embodiment of the present invention;

FIG. 20A is a schematic cross-sectional view for illustrating a step of forming a cover film in the method of manufacturing the flexible circuit board for mounting a light emitting element according to the fourth embodiment of the present invention;

FIG. 20B is a schematic cross-sectional view for illustrating the step of forming a cover film in the method of manufacturing the flexible circuit board for mounting a light emitting element according to the fourth embodiment of the present invention;

FIG. 21A is a schematic cross-sectional view showing a configuration of the flexible circuit board for mounting a light emitting element according to an embodiment of a seventh embodiment of the present invention;

FIG. 21B is a schematic cross-sectional view showing a configuration of the flexible circuit board for mounting a light emitting element according to another embodiment of the seventh embodiment of the present invention;

FIG. 22A is a schematic cross-sectional view showing a configuration of the flexible circuit board for mounting a light emitting element according to another embodiment of the seventh embodiment of the present invention;

FIG. 22B is a schematic cross-sectional view showing a configuration of the flexible circuit board for mounting a light emitting element according to another embodiment of the seventh embodiment of the present invention;

DETAILED DESCRIPTION OF THE PREFERRED EMBODIMENTS

First Embodiment

An first embodiment of the present invention will be described below in detail with reference to the drawings. A flexible circuit board 1 according to the first embodiment of the present invention is a suitable flexible circuit board (FPC: Flexible Print Circuit) for a carrier tape for TAB (Tape Automated Bonding).

Figure 1:
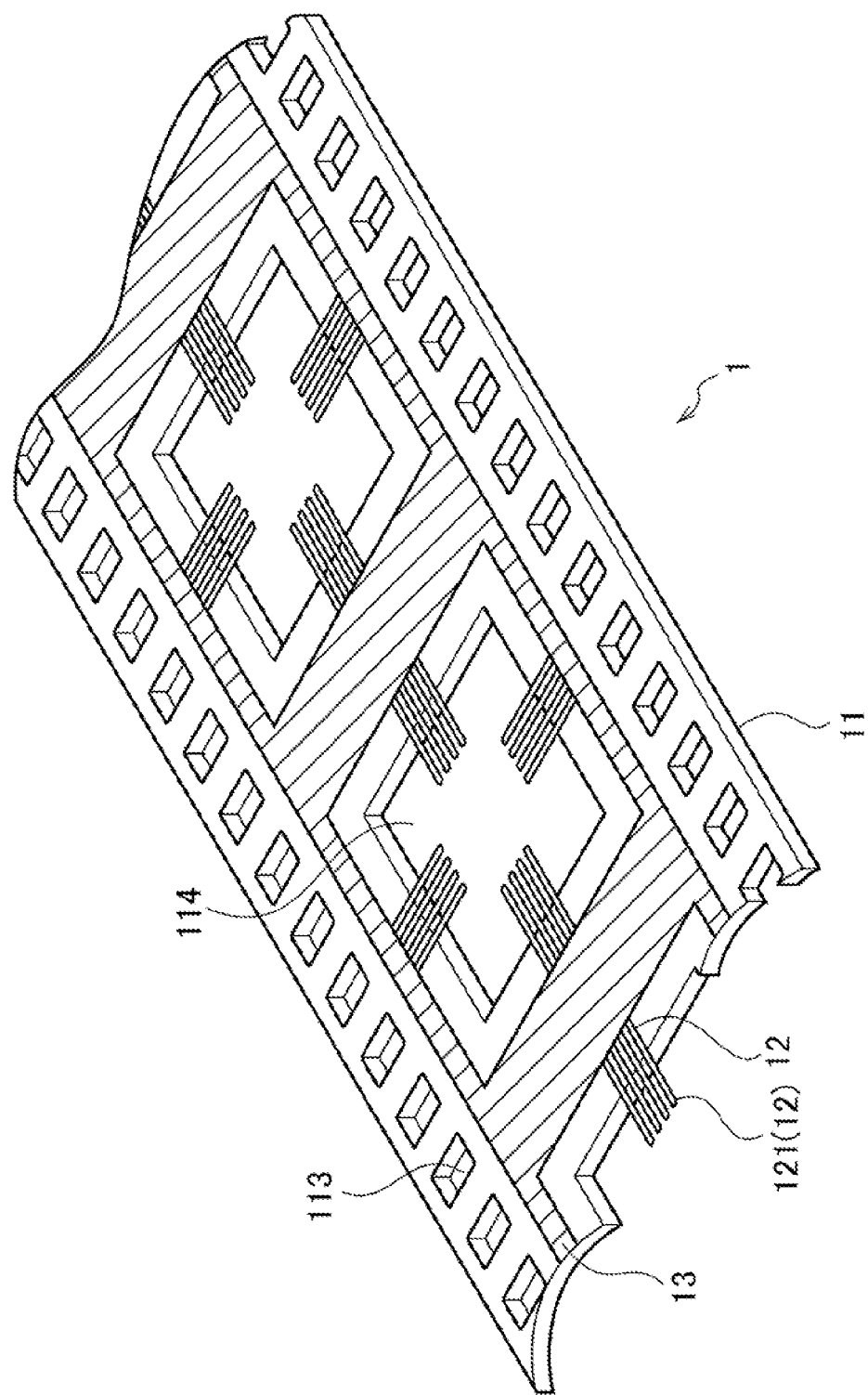
FIG. 1 is a perspective view schematically showing the configuration of a flexible circuit board according to a first embodiment of the present invention.

The configuration of the flexible circuit board 1 according to the first embodiment of the present invention will first be described. FIG. 1 is an external perspective view schematically showing the configuration of the flexible circuit board 1 according to the first embodiment of the present invention. FIG. 2 is a cross-sectional view schematically showing the configuration of the flexible circuit board 1 according to the first embodiment of the present invention.

As shown in FIGS. 1 and 2, the flexible circuit board 1 according to the first embodiment of the present invention includes a base film 11, a predetermined conductor pattern 12, and a second protective film 13. In the flexible circuit board 1 according to the first embodiment of the present invention, the predetermined conductor pattern 12 is formed through an adhesive 115 on a surface of the base film 11, and the second protective film 13 is formed so as to cover the predetermined conductor pattern 12. That is, the predetermined conductor pattern 12 is sandwiched between the base film 11 and the second protective film 13, except for a predetermined part (to be described later). Note that a laminated body 15 is formed on one surface of the base film 11 where the film of the adhesive 115 is laminated.

As shown in FIG. 1, the laminated body 15 including the base film 11 and the adhesive 115 is formed into a strip having a predetermined width. Sprocket holes 113 and device holes 114 are formed in the laminated body 15. The sprocket holes 113 and device holes 114 are each an opening extending through the laminated body 15 including the base film 11 in a thickness direction. The sprocket holes 113 are formed in each side edge of the base film 11 to be tandemly arranged at predetermined intervals along a longitudinal direction. The sprocket holes 113 are used to position and feed the flexible circuit board 1 according to the first embodiment of the present invention in a process of mounting a device, an electronic component, and the like on the flexible circuit board 1 according to the first embodiment of the present invention. Each device hole 114 is formed at a predetermined position of the base film 11. The device holes 114 are openings for mounting a device, an electronic component, and the like. The dimensions, shape, and position of each device hole 114 are appropriately set depending on a device or an electronic component to be mounted, the predetermined conductor pattern 12 to be formed, and the like and are not specifically limited.

As shown in FIG. 2, the base film 11 includes an aluminum sheet 111 and a first protective film 112. In the base film 11, the first protective film 112 is formed on each surface of the aluminum sheet 111, and the laminated body 15 is formed by bonding a film of the thermosetting adhesive 115 on a surface of one of the first protective films 112.

Note that the thickness of the aluminum sheet 111 is not specifically limited and is appropriately set depending on performance demanded of the flexible circuit board 1 according to the first embodiment of the present invention. For example, a thickness of 50 μm can be used. The material for and thickness of the first protective films 112 are also not specifically limited. For example, a film of insulating varnish having a thickness of 3 to 10 μm can be used as the first protective film 112. Similarly, the kind of the thermosetting adhesive 115 is not specifically limited. A thermosetting adhesive of any known kind can be used as the thermosetting insulating adhesive.

The configuration of the base film 11 is not limited to the configuration shown in FIG. 2. For example, the base film 11 may not include the first protective film 112. That is, the laminated body 15 may include the aluminum sheet 111 and the film of the thermosetting adhesive 115, and the film of the thermosetting adhesive 115 may be formed on one surface of the aluminum sheet 111.

The predetermined conductor pattern 12 is formed on the surface where the film of the thermosetting adhesive 115 is formed. The predetermined conductor pattern 12 is bonded to the one surface of the base film by the thermosetting adhesive 115. The predetermined conductor pattern 12 is a pattern which is to serve as a circuit in the flexible circuit board 1 according to the first embodiment of the present invention. The specific configuration of the predetermined conductor pattern 12 is appropriately set depending on the function, use, and the like of the flexible circuit board 1 according to the first embodiment of the present invention and is not specifically limited. For example, an aluminum sheet having a thickness of 10 to 50 μm or a copper sheet having a thickness of 9 to 35 μm can be used as the predetermined conductor pattern 12.

An inner lead 121 and a contact pad which is not shown are provided on the predetermined conductor pattern 12. The inner lead 121 is a portion for electrically connecting a device, an electronic component, or the like to be mounted on the flexible circuit board 1 according to the first embodiment of the present invention and the predetermined conductor pattern 12. As shown in FIGS. 1 and 2, the inner lead 121 is a portion projecting toward the inner side of the corresponding device hole 114. The contact pad (not shown) is a portion which is to serve as a contact for electrically connecting the flexible circuit board 1 according to the first embodiment of the present invention to the outside. A nickel coating and a gold coating are applied to the inner lead 121 and contact pad. More specifically, as shown in FIG. 2, a nickel-plated layer 122 is formed on the surface of the inner lead 121, and a gold-plated layer 123 is formed on the surface of the nickel film 122.

The second protective film 13 is formed on the one surface of the laminated body 15 including the base film 11 so as to cover the predetermined conductor pattern 12. The second protective film 13 is electrically insulative. For this reason, as shown in FIG. 2, the predetermined conductor pattern 12 is buried in the second protective film 13 so as not to be exposed to the outside. In other words, the predetermined conductor pattern 12 is sandwiched between the base film 11 and the second protective film 13. The second protective film 13 has a function of protecting the predetermined conductor pattern 12, a function of ensuring electric insulation between the predetermined conductor patterns 12, a function of preventing a short between the predetermined conductor pattern 12 and the outside, and other functions. A cover lay film which is made of an aramid-based resin composition and includes a film (not shown) of an adhesive formed on one surface can be used as the second protective film 13. For example, a film which includes a film of a polyimide-based adhesive formed thereon and is made of an aramid-based resin composition can be used. Alternatively, a film which includes a film of a polyimide-based adhesive formed thereon and is made of a polyimide-based resin composition can be used. Alternatively, a film which is made of a conductor such as aluminum and includes an electrically insulative film formed on a surface can be used as the second protective film 13. The material for the electrically insulative film is not specifically limited. For example, a resin composition of any known kind can be used. As described above, the second protective film 13 only needs to be electrically insulative.

A method for manufacturing the flexible circuit board 1 according to the first embodiment of the present invention will be described. The method for manufacturing the flexible circuit board 1 according to the first embodiment of the present invention includes an opening forming process, a conductor pattern forming process, and a predetermined process subsequent to the processes. The opening forming process is a process of forming the sprocket holes 113 and device holes 114 serving as openings in the laminated body 15 including the base film 11. The conductor pattern forming process is a process of forming the predetermined conductor pattern 12 such as a wiring pattern on the laminated body 15 with the openings formed therein.

FIGS. 3A to 3D and 4A to 4C are cross-sectional views schematically showing the opening forming process of the method for manufacturing the flexible circuit board 1 according to the first embodiment of the present invention.

Figure 3A:
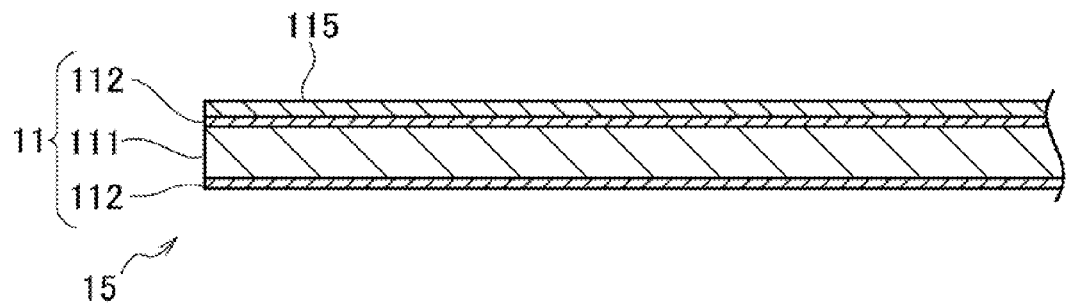
FIG. 3A is a cross-sectional view schematically showing a method for manufacturing the flexible circuit board according to the first embodiment of the present invention and is a view showing an opening forming process.
Figure 3B:
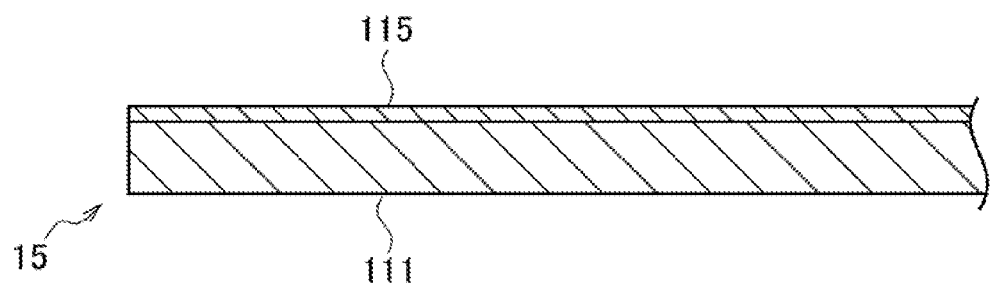
FIG. 3B is a cross-sectional view schematically showing the method for manufacturing the flexible circuit board according to the first embodiment of the present invention and is a view showing the opening forming process.

As shown in FIG. 3A, the base film 11 includes the aluminum sheet 111 and first protective film 112. In the base film 11, the first protective film 112 is formed on each surface of the aluminum sheet 111, and the laminated body 15 is formed by bonding a film of the thermosetting adhesive 115 on a surface of one of the first protective films 112. Note that the thickness of the aluminum sheet 111 is not specifically limited and is appropriately set depending on, e.g., performance demanded of the flexible circuit board 1 according to the first embodiment of the present invention. The configuration of the base film 11 is not limited to the configuration shown in FIG. 3A. For example, as shown in FIG. 3B, the base film 11 may not include the first protective film 112. That is, the laminated body 15 including the base film 11 may include the aluminum sheet 111 and a film of thermosetting adhesive 115, and the film of the thermosetting adhesive 115 may be formed on one surface of the aluminum sheet 111.

In the opening forming process, openings such as the sprocket hole 113 and the device hole 114 are formed in the laminated body 15 including the base film 11 and the adhesive 115. The openings extend through the base film 11 in the thickness direction.

Figure 3C:
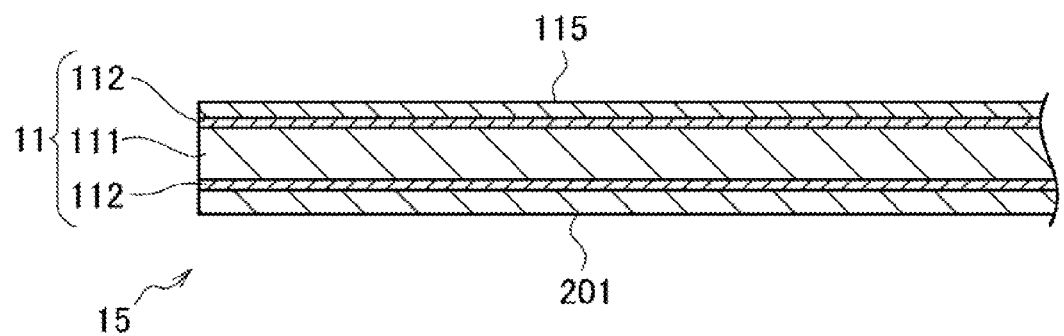
FIG. 3C is a cross-sectional view schematically showing the method for manufacturing the flexible circuit board according to the first embodiment of the present invention and is a view showing the opening forming process.

As shown in FIG. 3C, a film of a first photoresist 201 is formed on a surface (=the surface where the film of the thermosetting adhesive 115 is not formed) of the first protective film 112 of the base film 11. A known material and a known method can be used as the material for the film of the first photoresist 201 and a method for forming the film. For example, a process of coating a surface of the first protective film 112 of the base film 11 with the first photoresist 201 by roll-to-roll processing and drying the first photoresist 201 can be used. Although the first photoresist 201 may be of the positive type or the negative type, FIGS. 3C to 4B show a configuration in which the first photoresist 201 is of the negative type (a type which has a lower degree of solubility in a developer when irradiated with light energy).

Figure 3D:
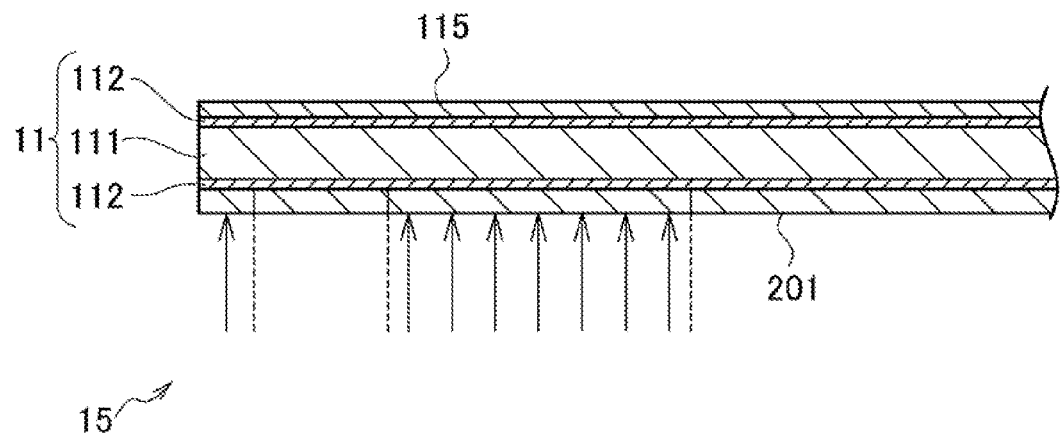
FIG. 3D is a cross-sectional view schematically showing the method for manufacturing the flexible circuit board according to the first embodiment of the present invention and is a view showing the opening forming process.

As shown in FIG. 3D, the formed film of the first photoresist 201 is subjected to exposure. More specifically, a predetermined pattern is formed in the film of the first photoresist 201 by an ultraviolet exposure machine (not shown). If the first photoresist 201 is of the negative type, positions where the sprocket hole 113 and device hole 114 as the openings are formed are not irradiated with light energy (e.g., ultraviolet rays), and positions other than the positions are irradiated with light energy, as shown in FIG. 3D. The arrows in FIG. 3D schematically show applied light energy.

Figure 4A:
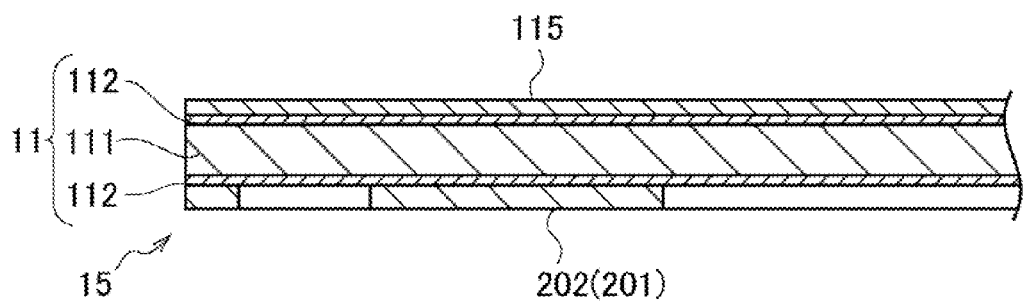
FIG. 4A is a cross-sectional view schematically showing the method for manufacturing the flexible circuit board according to the first embodiment of the present invention and is a view showing the opening forming process.

As shown in FIG. 4A, the film of the first photoresist 201 having undergone the exposure is subjected to development. More specifically, of the film of the first photoresist 201, parts at the positions where the sprocket hole 113 and device hole 114 are formed are removed. After the development, a first resist pattern 202 is formed. Note that, by the development, the parts of the first protective film 112 exposed at the positions where the sprocket hole 113 and the device hole 114 are to be formed are mechanically removed. Alternatively, the whole of the first protective film 112 may be chemically removed as shown in FIG. 3B before the first photoresist film 201 is formed.

Figure 4B:
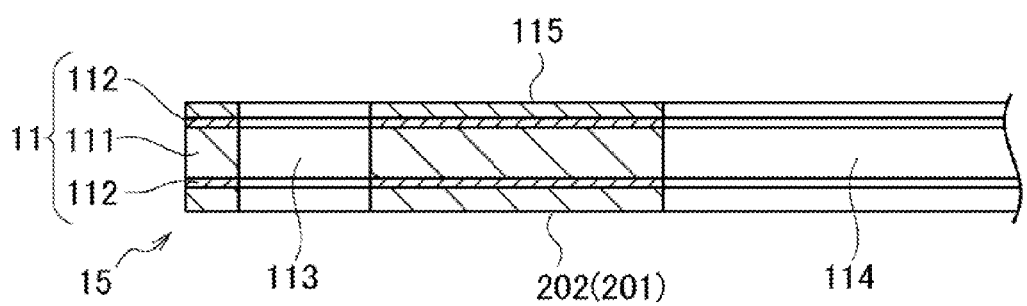
FIG. 4B is a cross-sectional view schematically showing the method for manufacturing the flexible circuit board according to the first embodiment of the present invention and is a view showing the opening forming process.
Figure 4C:
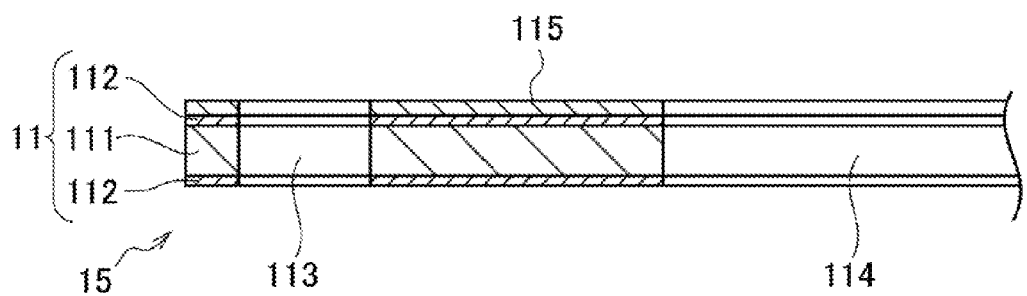
FIG. 4C is a cross-sectional view schematically showing the method for manufacturing the flexible circuit board according to the first embodiment of the present invention and is a view showing the opening forming process.

As shown in FIG. 4B, the base film 11 is etched using the formed first resist pattern 202 as an etch mask. A wet etching technique or a dry etching technique of any known kind can be used to etch the base film 11. With the etching, the sprocket hole 113 and device hole 114 as openings are formed in the laminated body 15 including the base film 11. After the sprocket hole 113 and device hole 114 are formed, the first resist pattern 202 is peeled off, as shown in FIG. 4C. For example, caustic soda is used to peel off the first resist pattern 202.

After the above-described process, the base film 11 with the sprocket hole 113 and device hole 114 as the openings formed therein is obtained. Note that although the first embodiment of the present invention has described a configuration in which openings are formed in the base film 11 by etching, openings may be formed by die-punching using a die or the like.

The flow shifts to the conductor pattern forming process. In the conductor pattern forming process, the predetermined conductor pattern 12 is formed on the a laminated body 15 with the sprocket hole 113 and device hole 114 formed therein. FIGS. 5A to 5D and 6A to 6C are views schematically showing the conductor pattern forming process of the method for manufacturing the flexible circuit board 1 according to the first embodiment of the present invention. Note that the specific configuration (e.g., the dimensions, shape, and number) of the predetermined conductor pattern 12 to be formed in the conductor pattern forming process is appropriately set depending on the function, use, and the like of the flexible circuit board 1 according to the first embodiment of the present invention and is not specifically limited.

Figure 5A:
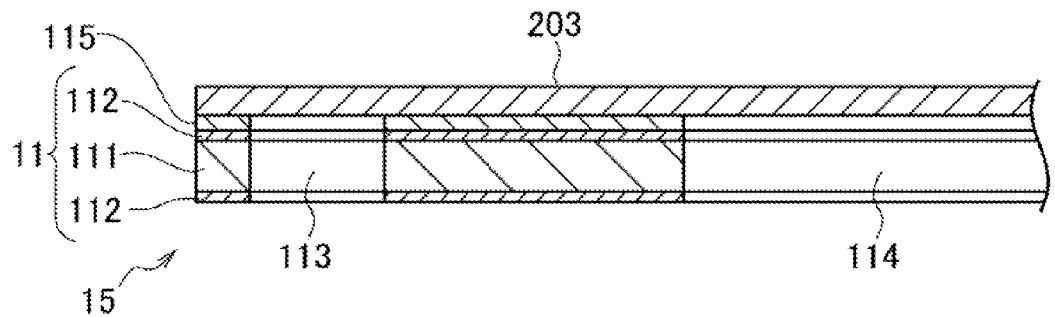
FIG. 5A is a cross-sectional view schematically showing the method for manufacturing the flexible circuit board according to the first embodiment of the present invention and is a view showing a conductor pattern forming process.

As shown in FIG. 5A, a conductor sheet 203 is bonded to a surface of the thermosetting adhesive 115 of the laminated body 15 with the through holes formed therein. The material for and the thickness of the conductor sheet 203 are appropriately set depending on a function and the like demanded of the conductor pattern 12 to be formed. For example, an aluminum sheet having a thickness of 10 to 50 μm or a copper sheet having a thickness of 9 to 35 μm can be used as the conductor sheet 203. For example, pressure bonding with heating can be used as a method for bonding the conductor sheet 203. The thermosetting adhesive 115 between the base film 11 and the bonded conductor sheet 203 is heat cured by batch-type heat treatment.

Figure 5B:
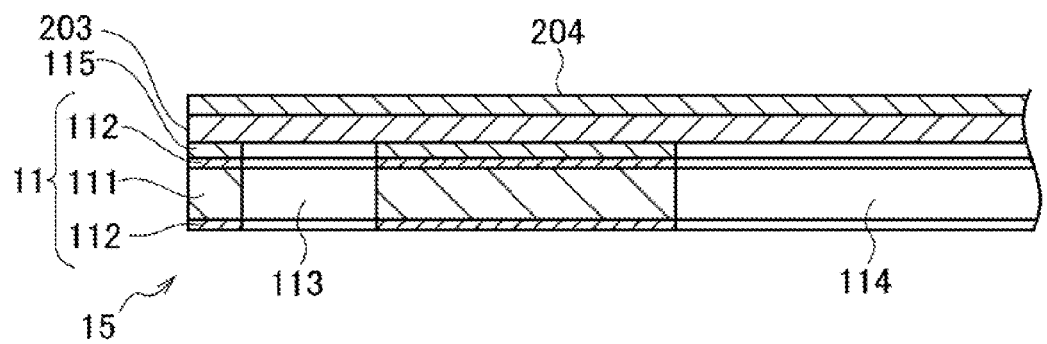
FIG. 5B is a cross-sectional view schematically showing the method for manufacturing the flexible circuit board according to the first embodiment of the present invention and is a view showing the conductor pattern forming process.
Figure 5C:
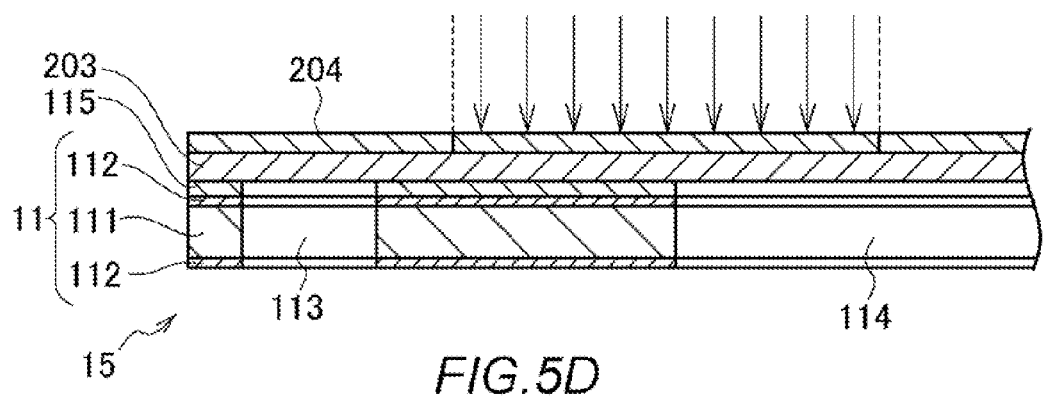
FIG. 5C is a cross-sectional view schematically showing the method for manufacturing the flexible circuit board according to the first embodiment of the present invention and is a view showing the conductor pattern forming process.
Figure 5D:
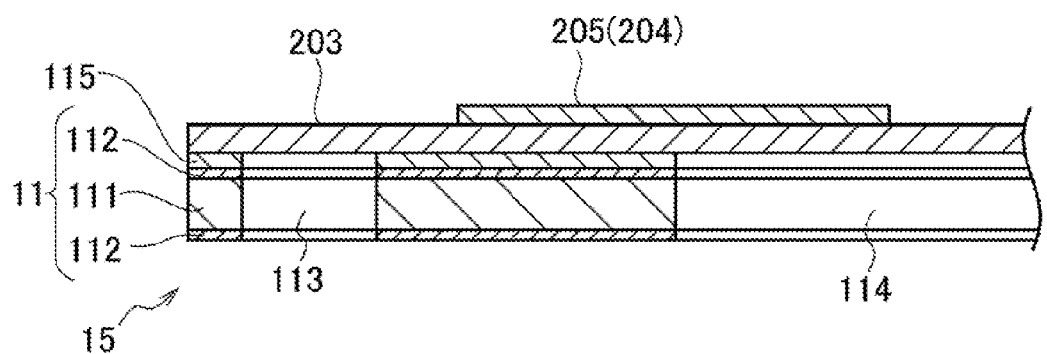
FIG. 5D is a cross-sectional view schematically showing the method for manufacturing the flexible circuit board according to the first embodiment of the present invention and is a view showing the conductor pattern forming process.

After the thermosetting adhesive 115 is cured, as shown in FIG. 5B, a film of a second photoresist 204 is formed on a surface of the conductor sheet 203. The kind of the second photoresist 204 is not specifically limited, and a photoresist material of any known kind, such as a photosensitive resin composition, can be used. Any known method can be used as a method for forming the second photoresist 204. For example, a process of applying the second photoresist 204 by roll-to-roll processing and then drying the applied second photoresist 204 can be used. As shown in FIG. 5C, the formed film of the second photoresist 204 is subjected to exposure. The arrows in FIG. 5C schematically show applied light energy. Although the second photoresist 204 may be of the positive type or the negative type, FIG. 5C shows as an example a configuration in which the second photoresist 204 is of the negative type (a type which has a lower degree of solubility in a developer when irradiated with light energy). As shown in FIG. 5D, the film of the second photoresist 204 having undergone the exposure is subjected to development. After the development, a second resist pattern 205 is formed on the surface of the conductor sheet 203.

Figure 6A:
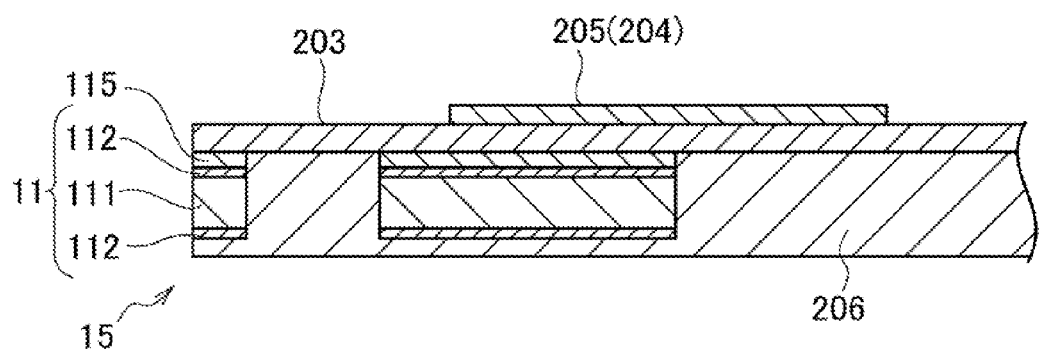
FIG. 6A is a cross-sectional view schematically showing the method for manufacturing the flexible circuit board according to the first embodiment of the present invention and is a view showing the conductor pattern forming process.

As shown in FIG. 6A, a masking film 206 is formed on a surface opposite to the surface where the second resist pattern 205 is formed. The masking film 206 is a film which protects the aluminum sheet 111 of the base film 11 to prevent the aluminum sheet 111 from being etched in a process of patterning the conductor sheet 203 by etching to form the predetermined conductor pattern 12. A thermosetting resist is used as the masking film 206. The type of the thermosetting resist is not specifically limited, and a thermosetting resist of any known kind can be used. For example, a process of applying a thermosetting resist serving as a material for the masking film 206 and curing the thermosetting resist by heating can be used as a method for forming the masking film 206. When the masking film 206 is formed, the aluminum sheet 111 of the base film 11 is covered with the masking film 206. The sprocket hole 113 and device hole 114 as the openings formed in the base film 11 are also filled with the thermosetting resist serving as the material for the masking film 206.

Figure 6B:
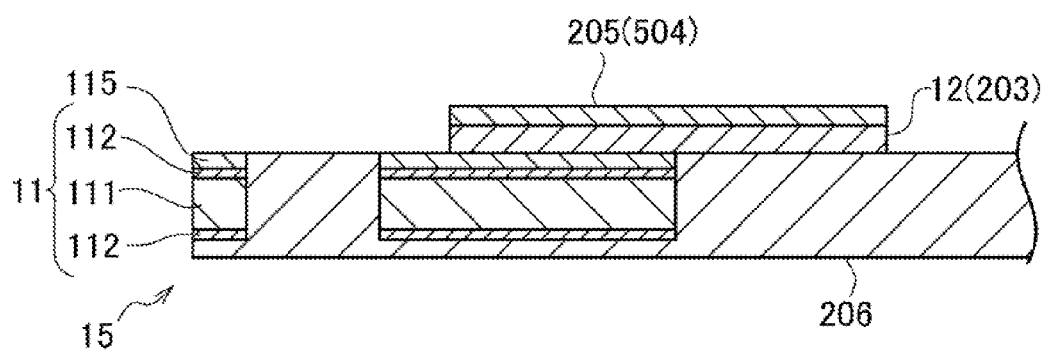
FIG. 6B is a cross-sectional view schematically showing the method for manufacturing the flexible circuit board according to the first embodiment of the present invention and is a view showing the conductor pattern forming process.
Figure 6C:
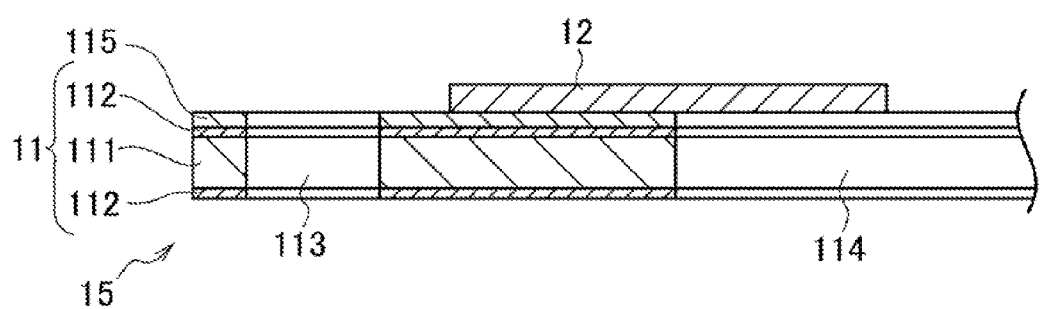
FIG. 6C is a cross-sectional view schematically showing the method for manufacturing the flexible circuit board according to the first embodiment of the present invention and is a view showing the conductor pattern forming process.

As shown in FIG. 6B, the conductor sheet 203 is etched using the formed second resist pattern 205 as an etch mask. With the etching, the conductor sheet 203 is patterned to obtain the predetermined conductor pattern 12. Since the aluminum sheet 111 of the base film 11 is covered with the masking film 206, as described above, the aluminum sheet 111 is not etched. That is, the masking film 206 protects the aluminum sheet 111. After the etching, as shown in FIG. 6C, the second resist pattern 205 and masking film 206 are peeled off (removed). For example, caustic soda is used to peel off the second resist pattern 205 and masking film 206.

After the above-described process, the predetermined conductor pattern 12 is formed on the base film 11.

Figure 7A:
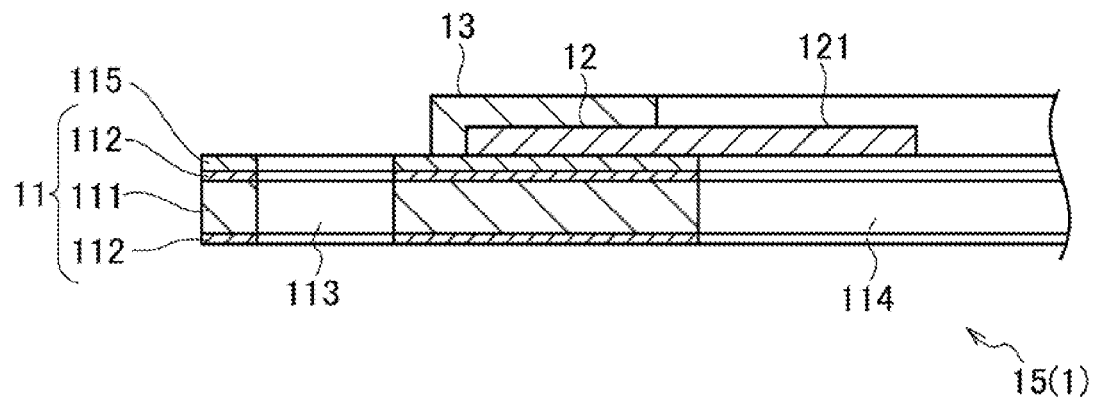
FIG. 7A is a cross-sectional view schematically showing the method for manufacturing the flexible circuit board according to the first embodiment of the present invention and is a view showing a process subsequent to the opening forming process and the conductor pattern forming process.
Figure 7B:
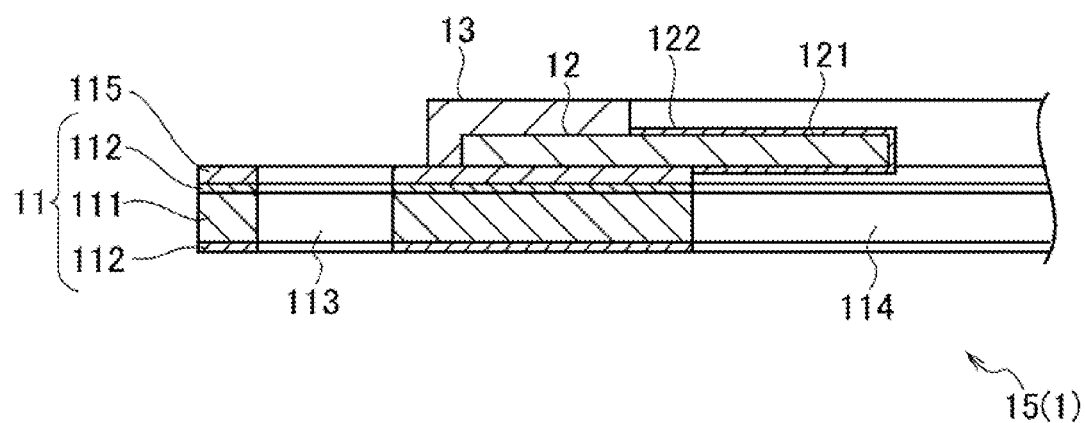
FIG. 7B is a cross-sectional view schematically showing the method for manufacturing the flexible circuit board according to the first embodiment of the present invention and is a view showing the process subsequent to the opening forming process and the conductor pattern forming process.
Figure 7C:
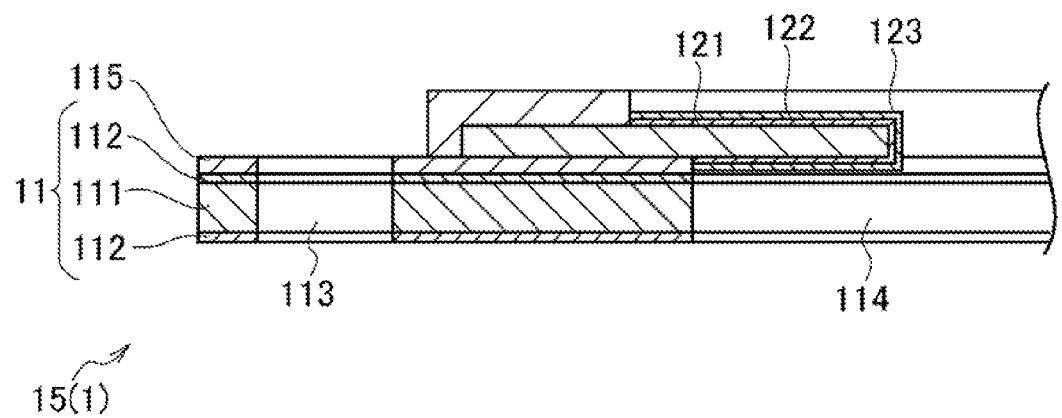
FIG. 7C is a cross-sectional view schematically showing the method for manufacturing the flexible circuit board according to the first embodiment of the present invention and is a view showing the process subsequent to the opening forming process and the conductor pattern forming process.

FIGS. 7A to 7C are cross-sectional views schematically showing a process subsequent to the opening forming process and the conductor pattern forming process in the method for manufacturing the flexible circuit board 1 according to the first embodiment of the present invention.

After the opening forming process and the conductor pattern forming process, as shown in FIG. 7A, the second protective film 13 is formed so as to cover the predetermined conductor pattern 12. The second protective film 13 has a function of protecting the predetermined conductor pattern 12, a function of ensuring electric insulation between the predetermined conductor patterns 12, and a function of ensuring electric insulation between the predetermined conductor pattern 12 and another member. A cover lay film which includes a film (not shown) of a thermosetting adhesive formed on one surface can be used as the second protective film 13. First, the second protective film 13 is formed to have a predetermined shape. The second protective film 13 is positioned and bonded to the surface of the laminated body 15 after the processes with the film of the adhesive formed on the second protective film 13. The bonded second protective film 13 is heated to cure the adhesive. After the process, the predetermined conductor pattern 12 is covered with the second protective film 13 except a predetermined part (the inner lead 121 and a contact pad in this example).

Note that the material for the second protective film 13 is not specifically limited. For example, a film of an aramid-based resin or an aluminum film can be used as the cover lay film for the second protective film 13. If an aluminum film is used as the cover lay film, a film of an electrically insulative material is formed on a surface of the aluminum film.

As shown in FIGS. 7B and 7C, the predetermined part of the formed conductor pattern 12 is plated. More specifically, as shown in FIG. 7B, the predetermined part of the conductor pattern 12 is plated with nickel to form the nickel film 122. As shown in FIG. 7C, the nickel-plated part is plated with gold to form the gold film 123. Note that the "predetermined part" plated with the metals includes, for example, the inner lead 121 and the contact pad. The inner lead 121 and the contact pad are portions serving as contacts for connection to a component to be mounted or the outside. The inner lead 121 is a portion projecting toward the inner side of the opening as the corresponding device hole 114.

After the above-described processes, manufacturing of the flexible circuit board 1 according to the first embodiment of the present invention is completed.

The flexible circuit board 1 according to the first embodiment of the present invention and the method for manufacturing the flexible circuit board 1 according to the first embodiment of the present invention can produce the working-effects below.

The flexible circuit board 1 according to the first embodiment of the present invention includes the aluminum sheet 111 as the base film 11. Deformation or a dimensional change caused by a temperature change or moisture absorption can be more effectively suppressed in the flexible circuit board 1 than in a configuration including a sheet of a resin composition.

Table 1 below is a table indicating a dimensional change of a flexible circuit board with a base film made of aluminum (=the flexible circuit board 1 according to the first embodiment of the present invention) and a dimensional change of a flexible circuit board with a base film made of polyimide (a comparative example). More specifically, Table 1 indicates a difference between the spacing between sprocket holes after the sprocket holes are formed and the spacing after completion of a flexible circuit board. Note that a three-dimensional measuring machine is used to measure the spacing between sprocket holes. The base film 11 of the flexible circuit board 1 according to the first embodiment of the present invention and the base film of the flexible circuit board as the comparative example each have a thickness of 50 μm and a width (=dimension in the X-axis direction) of 151 mm. A change in longitudinal dimension (=dimension in the Y-axis direction) is a dimensional change with respect to 147.25 mm.

TABLE 1

Dimensional Change Comparison

| | X-axis direction (with respect to product width of 151 mm) | Y-axis direction (with respect to product longitudinal dimension of 147.25 mm) |
|---|---|---|
| Embodiment of present invention (aluminum with thickness t of 50 μm) | −0.024 mm | −0.012 mm |
| Comparative example (polyimide with thickness t of 50 μm) | −0.057 mm | −0.039 mm |

As shown in Table 1, a dimensional change in the X-axis direction (width direction) of the flexible circuit board as the comparative example is −0.057 mm, and a dimensional change in the X-axis direction of the flexible circuit board 1 according to the first embodiment of the present invention is −0.024 mm. A dimensional change in the Y-axis direction (longitudinal direction) of the flexible circuit board as the comparative example is −0.039 mm, and a dimensional change in the Y-axis direction of the flexible circuit board 1 according to the first embodiment of the present invention is −0.012 mm. As seen from the above, the flexible circuit board 1 according to the first embodiment of the present invention is lower in elasticity (i.e., smaller in dimensional change) than the conventional flexible circuit board made of a polyimide-based resin composition. Accordingly, even if a flexible circuit board with a larger width is to be manufactured, an increase in the yield of products can be achieved (or a reduction in the yield can be prevented).

Since aluminum has higher thermal conductivity and higher thermal dissipation capability than a resin composition, thermal load on a component to be mounted can be reduced. The reduction in thermal load allows or facilitates an increase in the density or the number of predetermined pieces of wiring or components or devices to be mounted. Additionally, aluminum blocks electromagnetic waves, and effects of external electromagnetic waves or unwanted emissions (EMI) to the outside can be prevented or suppressed. Further, the price of the base film 11 can be made lower than a case using a resin material (e.g., polyimide). For this reason, a reduction in product price can be achieved.

If the second protective film 13 is composed of an aluminum film, the working-effects below can be produced. Aluminum is less expensive than a resin composition, and material cost can be reduced. Accordingly, a configuration using an aluminum film as the second protective film 13 can be manufactured at lower cost than a configuration using a film of a resin composition. Also, aluminum has higher thermal conductivity and higher thermal dissipation capability than a resin composition, and thermal load on a device or a component to be mounted can be further reduced. Additionally, since the conductor pattern 12 is sandwiched between the aluminum sheet 111 of the base film 11 and the aluminum film of the second protective film 13, effects of external electromagnetic waves or unwanted emissions (EMI) to the outside can be further prevented or suppressed.

Although the arrangement according to this embodiment has a predetermined wiring pattern formed in a single layer, the arrangement may have a predetermined wiring pattern formed in a plurality of layers. Further, the embodiment has described both a sprocket hole and a device hole as openings to be formed in a laminated body including a base film. Either one or both of sprocket holes and device holes may be formed. Openings to be formed in a laminated body are not limited to either one or both of sprocket holes and device holes. An opening of any kind may be used as long as the opening is formed in a base film and extends through the base film in a thickness direction.

Next, second to seventh embodiments of the present invention will be described in detail with reference to the drawings.

(Configuration Common to Second to Seventh Embodiments)

Figure 8:
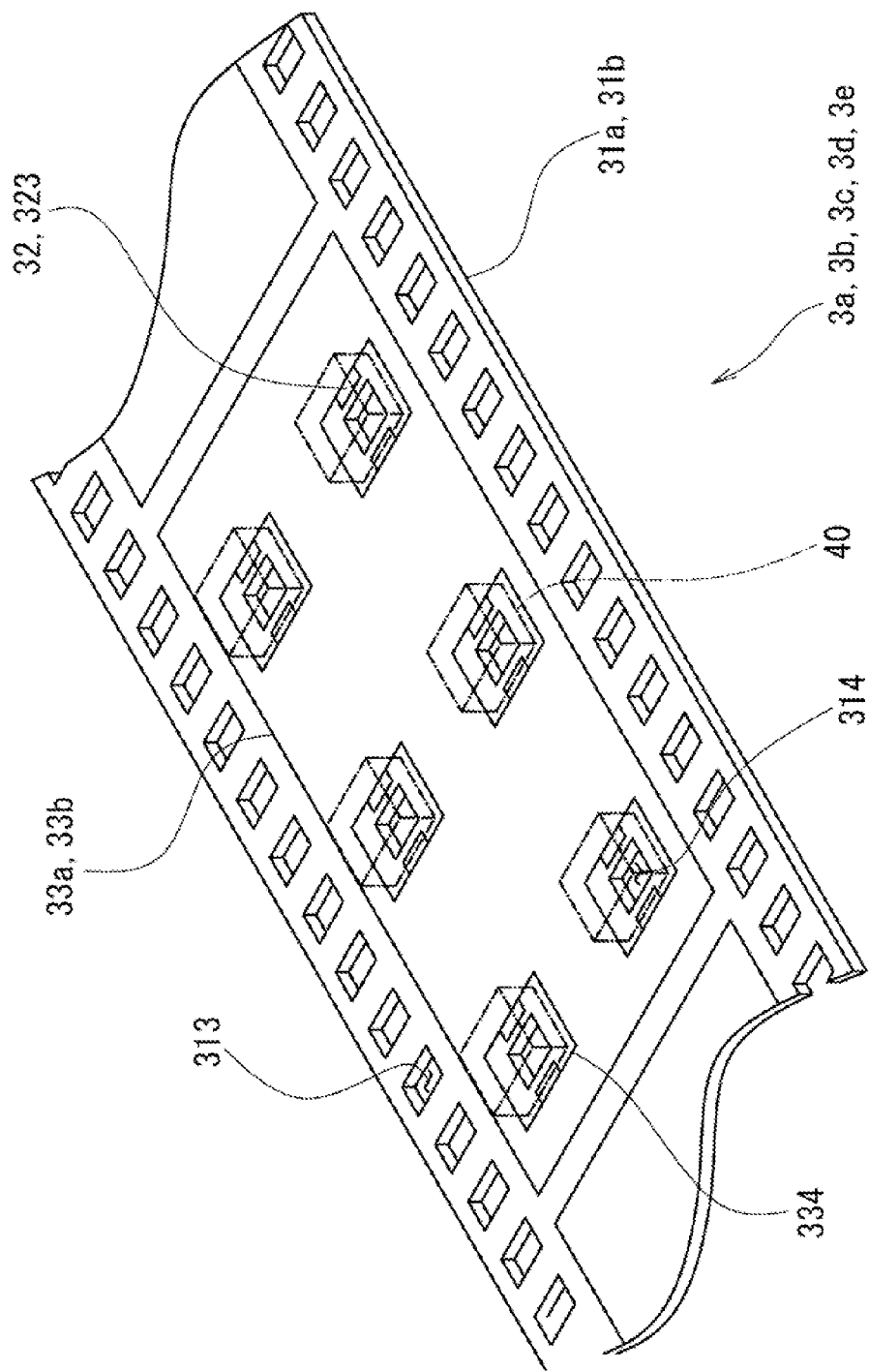
FIG. 8 is a schematic perspective view showing a configuration of flexible circuit boards for mounting a light emitting element according to second to seventh embodiments of the present invention.

First, a common configuration of flexible circuit boards 3a to 3e for mounting a light emitting element according to the second to seventh embodiments of the present invention will be described with reference to FIG. 8. FIG. 8 is a schematic perspective view showing a general configuration of the flexible circuit boards 3a to 3e for mounting alight emitting element according to embodiments of the present invention. As shown in FIG. 8, the flexible circuit boards 3a to 3e for mounting a light emitting element according to embodiments comprise base films 31a and 31b, a wiring pattern 32, and the cover films 33a and 33b. The wiring pattern 32 is formed on a surface of the base films 31a and 31b, and the cover films 33a and 33b are disposed to cover the wiring pattern 32.

The base films 31a and 31b are flexible films. The base films 31a and 31b have openings formed therein (through-holes penetrating the base film in the thickness direction), such as a sprocket hole 313 and a device hole 314. The sprocket hole 313 is used for feeding or positioning of the flexible circuit boards 3a to 3e for mounting a light emitting element according to embodiments in the process of mounting a light emitting element 40 or other predetermined elements on the flexible circuit boards 3a to 3e for mounting a light emitting element according to embodiments. The device hole 314 is a mounting opening into which a semiconductor device or the like is mounted. The sprocket hole is not essential if the feeding or positioning function of the sprocket hole is served by other means. Similarly, the device hole 314 is not essential if a surface-mount light emitting element is to be mounted.

The wiring pattern 32 is a thin film pattern of a conductor, such as a metal material. For example, the wiring pattern 32 is formed of a copper film having a thickness of approximately 9 to 50 μm. The specific configuration of the wiring pattern 32 is not particularly limited and can be appropriately determined considering the circuit configuration of the flexible circuit boards 3a to 3e for mounting a light emitting element according to each embodiment. The cover films 33a and 33b are disposed to cover the surface of the flexible circuit boards 3a to 3e for mounting a light emitting element according to embodiments on which the light emitting element 40 is mounted. The cover film 33a has such surface properties as to produce specular reflection of light or such surface irregularities as to produce diffuse reflection of light. Alternatively, the cover films 33a and 33b may have a substantially white reflecting films 36 and 333 on a surface thereof. The reflecting films 36 and 333 are substantially white coating or film and produce diffuse reflection by the action of a white pigment contained therein (as described later). The cover films 33a and 33b (or the reflecting films 36 and 333 on the surface thereof) have a function of allowing efficient use of the light emitted by the light emitting element 40 mounted on the flexible circuit boards 3a to 3e for mounting a light emitting element according to embodiments by reflecting the light emitting element 40. The cover films 33a and 33b further have a function of protecting the wiring pattern 32. The cover films 33a and 33b have an opening 334 formed therein (a through-hole penetrating the cover film in the thickness direction). A predetermined part of the wiring pattern 32 is exposed in the opening 334.

The part of the wiring pattern 32 exposed in the opening 334 may be a contact pad 323 or an inner lead (not shown). The contact pad 323 is a part for electrically connecting the light emitting element 40 or other predetermined electronic parts to the wiring pattern 32. The contact pad 323 functions also as a contact of the flexible circuit boards 3a to 3e for mounting a light emitting element according to embodiments of the present invention to be electrically connected to an external apparatus. Furthermore, a nickel-plating film 321 and a gold-plating film 322 are formed one on another on the surface of the exposed part of the wiring pattern 32 (see FIGS. 9A to 14D).

The base film 31a and the cover film 33a have substrates 311 and 331a made of a metal material, respectively.

With the flexible circuit boards 3a to 3e for mounting a light emitting element according to embodiments of the present invention, the light emitting element 40 can be soldered or otherwise mounted to the wiring pattern 32 (contact pad 323) exposed in the opening 334. In FIG. 8, the light emitting element 40 to be mounted is shown by an alternate short and long dash line.

Next, each of the flexible circuit boards 3a to 3e for mounting a light emitting element according to embodiments will be described. FIGS. 9A to 13B are schematic cross-sectional views showing configurations of the flexible circuit boards 3a to 3e for mounting a light emitting element according to embodiments of the present invention. Note that FIGS. 9A to 13B are schematic diagrams given for illustrative purposes and do not illustrate any specific actually possible cross-sectional configuration.

Second Embodiment

The flexible circuit board 3a for mounting a light emitting element according to a second embodiment of the present invention will be described with reference to FIGS. 9A and 9B. FIGS. 9A and 9B are schematic cross-sectional views showing configurations of the flexible circuit board 3a for mounting a light emitting element according to the second embodiment of the present invention. FIG. 9A shows a configuration in which the surface of a cover film 33a has no irregularities, and FIG. 9B shows a configuration in which the surface of the cover film 33a has irregularities.

As shown in FIGS. 9A and 9B, a base film 31a of the flexible circuit board 3a for mounting a light emitting element according to the second embodiment has a laminate structure comprising a film-shaped substrate 311 and protective films 312 formed on the surfaces of the substrate 311. The substrate 311 is made of a metal material. The substrate 311 is an aluminum film having a thickness of 8 to 100 μm, for example. The protective film 312 is made of an electrically insulating material. The protective film 312 is a polyimide (PI) film having a thickness of several μm, for example. A film of an adhesive 34 is formed on a surface of the base film 31a, and a wiring pattern 32 is bonded to the surface of the base film 31a by the adhesive 34. The adhesive can be any of various well-known thermosetting adhesives (or any of various well-known thermosetting resin materials).

The cover film 33a comprises a film-shaped substrate 331a made of a metal material and protective films 332 formed on the surfaces of the substrate 331a. The substrate 331a is an aluminum film having a thickness of 8 to 100 μm that has such surface properties as to produce specular reflection of light, for example. The protective film 332 is a polyimide film having a thickness of approximately 4 μm, for example. Polyimide is a resin material that is brown in color but appears substantially transparent at small thicknesses.

Thus, the surface of the cover film 33a shows the gloss of the metal of the substrate 331a and has substantially the same surface properties as the substrate 331a in terms of light reflection that produce specular reflection of light. Therefore, the reflectance of the surface of the cover film 33a is higher than that of a film made of a resin material alone. The cover film 33a is bonded to the surface of the wiring pattern 32 and the base film 31a by a thermosetting adhesive 35, for example. The cover film 33a has the opening 334 formed at a predetermined position. A predetermined part (a contact pad 323, for example) of the wiring pattern 32 is exposed in the opening 334. The position, the dimensions and the shape of the opening 334 can be appropriately determined considering the positions of other predetermined elements including a light emitting element 40 to be mounted and the dimensions and shapes of the other predetermined elements including the light emitting element 40.

The surface of the cover film 33a may be a substantially planar surface having no irregularities as shown in FIG. 9A or a surface having irregularities as shown in FIG. 9B.

If the surface of the cover film 33a has no irregularities as shown in FIG. 9A, the cover film 33a produces specular reflection of light. In this case, the surface roughness Ra of the aluminum film forming the substrate 331a falls within a range of 0.03 to 0.05 μm or is smaller than the range. With such a configuration, the light emitted by the light emitting element 40 is specularly reflected by the surface of the cover film 33a. The amount of light wasted can be reduced, so that the number of light emitting elements 40 to be mounted can be reduced without decreasing the amount of light.

On the other hand, if the surface of the cover film 33a has irregularities as shown in FIG. 9B, the cover film 33a produces diffuse reflection of light. The irregularities are preferably depressions having a depth of 15 to 80 μm formed in pitch of 100 to 3000 μm, for example. In general, an LED emits light with high directivity. If the light emitting element 40 is an LED, the surface of the cover film 33a can produce diffuse reflection of the light emitted by the LED, thereby decreasing the directivity of the light and reducing the non-uniformity of the in-plane light intensity distribution. Thus, the light emitted by the light emitting element 40 can be efficiently used, and the in-plane intensity distribution of the light can be made uniform. For example, in a case where a surface light source is formed by the flexible circuit board 3a for mounting a light emitting element according to the second embodiment, the plurality of LEDs mounted can be arranged at greater intervals while preventing the in-plane light intensity distribution from being nonuniform. Therefore, the number of light emitting elements 40 to be mounted can be reduced. Since the substrate 331a of the cover film 33a is made of a metal material, such as aluminum, the irregularities can be easily formed on the surface in a transfer molding process or the like.

The surface of the cover film 33a may or may not have the irregularities depending on the application of the flexible circuit board 3a for mounting a light emitting element according to the second embodiment.

Furthermore, a nickel-plating film 321 and a gold-plating film 322 are formed one on another on the surface of the part (the contact pad 323, for example) of the wiring pattern 32 exposed in the opening 334 of the cover film 33a.

With the flexible circuit board 3a for mounting a light emitting element according to the second embodiment, both the base film 31a and the cover film 33a have the substrates 311 and 331a made of a metal material, respectively. Metal materials have higher thermal conductivities than resin materials. Thus, the heat generated by the mounted light emitting element 40 can be quickly radiated through the base film 31a and the cover film 33a. Therefore, the temperature of the light emitting element 40 can be prevented from increasing, and thereby preventing the properties of the light emitting element 40 from being deteriorated by heat. In addition, the cover film 33a is disposed on the surface on which the light emitting element 40 is mounted. The surface of the cover film 33a shows the gloss of the metal of the substrate 331a and has a higher reflectance than a film made of a resin material alone. Therefore, more of the light emitted by the light emitting element 40 can be reflected rather than absorbed. As described above, the flexible circuit board 3a for mounting a light emitting element according to the second embodiment can prevent the temperature of the mounted light emitting element 40 from increasing and allow efficient use of the light emitted by the light emitting element 40.

Third Embodiment

Next, the flexible circuit board 3b for mounting a light emitting element according to a third embodiment of the present invention will be described with reference to FIGS. 10A and 10B. The same components as those of the flexible circuit board 3a for mounting a light emitting element according to the second embodiment are denoted by the same reference numerals, and descriptions thereof may be omitted. FIGS. 10A and 10B are schematic cross-sectional views showing configurations of the flexible circuit board 3b for mounting a light emitting element according to the third embodiment of the present invention. FIG. 10A shows a configuration in which the surface of a reflecting film 36 has no irregularities, and FIG. 10B shows a configuration in which the surface of the reflecting film 36 has irregularities.

As shown in FIGS. 10A and 10B, a base film 31a, a wiring pattern 32, and a cover film 33a are the same as those of the flexible circuit board 3a for mounting a light emitting element according to the second embodiment. Therefore, descriptions thereof will be omitted.

According to this embodiment, the reflecting film 36 is formed on the surface of the cover film 33a. The reflecting film 36 is a substantially white thermosetting solder resist film or other film having a substantially white surface.

The solder resist may be the white thermosetting solder resist with high reflectance (model number: PSR-4000 LEW&W series) manufactured by TAIYO INK MFG CO., LTD., for example. If this solder resist is used, the reflecting film 36 can have a thickness of approximately 15 to 50 μm. With such a configuration, the flexible circuit board 3b for mounting a light emitting element according to the third embodiment can have an increased surface reflectance.

The film having a substantially white surface may be a film having a laminate structure comprising a substrate formed by a film made of a resin material and a coating film formed on a surface of the substrate. For example, the reflecting film 36 may comprise a polyimide film having a thickness of 8 to 50 μm serving as the substrate and a film containing titanium oxide having a thickness of 10 to 75 μm serving as the coating film.

With such a configuration, the surface of the cover film 33a can be substantially white in color and have an increased reflectance.

The surface of the reflecting film 36 may be a surface having no irregularities as shown in FIG. 10A or a surface having irregularities as shown in FIG. 10B. The configuration of the irregularities formed on the surface of the reflecting film 36 is the same as that of the flexible circuit board 3a for mounting a light emitting element according to the second embodiment. Therefore, descriptions thereof will be omitted.

With the flexible circuit board 3b for mounting a light emitting element according to the third embodiment, both the base film 31a and the cover film 33a have the substrates 311 and 331a made of a metal material, respectively. Metal materials have higher thermal conductivities than resin materials, so that the heat generated by the mounted light emitting element 40 can be quickly radiated through the base film 31a and the cover film 33a. Therefore, the temperature of the light emitting element 40 can be prevented from increasing, and thereby preventing the properties of the light emitting element 40 from being deteriorated by heat. In addition, the cover film 33a is disposed on the surface on which the light emitting element 40 is mounted, and the substantially white reflecting film 36 is formed on the surface of the cover film 33a. The reflecting film 36 has a higher reflectance than common resin materials (polyimide, for example) used for protecting circuit boards. Therefore, more of the light emitted by the light emitting element 40 can be reflected rather than absorbed. As described above, the flexible circuit board 3b for mounting a light emitting element according to the third embodiment can prevent the temperature of the mounted light emitting element 40 from increasing and allow efficient use of the light emitted by the light emitting element 40.

The effects and advantages of the irregularities formed on the surface of the reflecting film 36 as well as the differences in effects and advantages between the presence and absence of the irregularities are the same as those of the flexible circuit board 3a for mounting a light emitting element according to the second embodiment.

Fourth Embodiment

Next, the flexible circuit board 3c for mounting a light emitting element according to a fourth embodiment of the present invention will be described with reference to FIG. 11. FIG. 11 is a schematic cross-sectional view showing a configuration of the flexible circuit board 3c for mounting a light emitting element according to the fourth embodiment of the present invention.

A base film 31a and a wiring pattern 32 of the flexible circuit board 3c for mounting a light emitting element according to the fourth embodiment are the same as those of the flexible circuit board 3a for mounting a light emitting element according to the second embodiment. Therefore, descriptions thereof will be omitted.

A cover film 33b is formed on the surface of the wiring pattern 32. The cover film 33b comprises a substrate 331b formed by a film made of a resin material and a substantially white reflecting film 333 formed on the surface of the substrate 331b. The substrate 331b can be a polyimide film having a thickness of 8 to 50 μm, for example. The substantially white reflecting film 333 can be a film containing titanium oxide having a thickness of 10 to 75 μm, for example. With such a configuration, the surface of the cover film 33b can have an increased reflectance. A film of an adhesive 35 is formed on the surface of the substrate 331b facing an adhesive 34 on the surface of the base film, and the cover film 33b is bonded to the surface of a wiring pattern 32 and the base film 31a by the adhesive 35. Note that the film containing titanium oxide used as the substantially white reflecting film 333 in this embodiment can be replaced with the substantially white thermosetting solder resist used as the reflecting film 36 in the third embodiment.

With the flexible circuit board 3c for mounting a light emitting element according to the fourth embodiment, the base film 31a is a film comprising the substrate 311 made of a metal material. Metal materials have higher thermal conductivities than resin materials, so that the heat generated by the mounted light emitting element 40 can be quickly radiated through the base film 31a. Therefore, the temperature of the light emitting element 40 can be prevented from increasing, and thereby preventing the properties of the light emitting element 40 from being deteriorated by heat. In addition, the cover film 33b is disposed on the surface on which the light emitting element 40 is mounted. The cover film 33b has the substantially white reflecting film 333 as the surface thereof. Therefore, more of the light emitted by the light emitting element 40 can be reflected rather than absorbed. As described above, the flexible circuit board 3c for mounting alight emitting element according to the fourth embodiment can prevent the temperature of the mounted light emitting element 40 from increasing and allow efficient use of the light emitted by the light emitting element 40.

Fifth Embodiment

Next, the flexible circuit board 3d for mounting a light emitting element according to a fifth embodiment of the present invention will be described with reference to FIGS. 12A and 12B. FIGS. 12A and 12B are schematic cross-sectional views showing configurations of the flexible circuit board 3d for mounting a light emitting element according to the fifth embodiment of the present invention. FIG. 12A shows a configuration in which the surface of a cover film 33a has no irregularities, and FIG. 12B shows a configuration in which the surface of the cover film 33a has irregularities. The same components as those of the flexible circuit board 3a for mounting a light emitting element according to the second embodiment are denoted by the same reference numerals, and descriptions thereof may be omitted.

A base film 31b of the flexible circuit board 3d for mounting a light emitting element according to the fifth embodiment is made of a resin material. For example, the base film 31b is a polyimide film having a thickness of 8 to 125 μm. A film of an adhesive 34 is formed on a surface of the base film 31b. A wiring pattern 32 is bonded to the surface of the base film 31b by the adhesive 34. The adhesive 34, the wiring pattern 32 and the cover film 33a are the same as those of the flexible circuit board 3a for mounting a light emitting element according to the second embodiment. Therefore, descriptions thereof will be omitted.

The surface of the cover film 33a may be a surface having no irregularities as shown in FIG. 12A or a surface having irregularities as shown in FIG. 12B. The configuration of the irregularities formed on the surface of the cover film 33a is the same as that of the flexible circuit board 3a for mounting a light emitting element according to the second embodiment.

As described above, with the flexible circuit board 3d for mounting alight emitting element according to the fifth embodiment, the cover film 33a is a film comprising a substrate 331a made of a metal material. Metal materials have higher thermal conductivities than resin materials, so that the heat generated by the mounted light emitting element 40 can be quickly radiated through the cover film 33a. Therefore, the temperature of the light emitting element 40 can be prevented from increasing, and thereby preventing the properties of the light emitting element 40 from being deteriorated by heat. In addition, the surface of the cover film 33a shows the gloss of the metal of the substrate 331a and has a high reflectance. Therefore, more of the light emitted by the light emitting element 40 can be reflected rather than absorbed. As described above, the flexible circuit board 3d for mounting a light emitting element according to the fifth embodiment can prevent the temperature of the mounted light emitting element 40 from increasing and allow efficient use of the light emitted by the light emitting element 40.

The effects and advantages of the irregularities formed on the surface of the cover film 33a as well as the differences in effects and advantages between the presence and absence of the irregularities are the same as those of the flexible circuit board 3a for mounting a light emitting element according to the second embodiment.

Sixth Embodiment

Next, the flexible circuit board 3e for mounting a light emitting element according to a sixth embodiment of the present invention will be described with reference to FIGS. 13A and 13B. FIGS. 13A and 13B are schematic cross-sectional views showing configurations of the flexible circuit board 3e for mounting a light emitting element according to the sixth embodiment of the present invention. FIG. 13A shows a configuration in which the surface of a cover film 33a has no irregularities, and FIG. 13B shows a configuration in which the surface of the cover film 33a has irregularities. The same components as those of the flexible circuit board 3d for mounting a light emitting element according to the fifth embodiment are denoted by the same reference numerals, and descriptions thereof may be omitted.

A base film 31b, a wiring pattern 32 and the cover film 33a of the flexible circuit board 3e for mounting a light emitting element according to the sixth embodiment are the same as those of the flexible circuit board 3d for mounting a light emitting element according to the fifth embodiment. Therefore, descriptions thereof will be omitted. In the flexible circuit board 3d for mounting a light emitting element according to the fifth embodiment, the wiring pattern 32 is bonded to the base film 31b by the adhesive 34. However, in the flexible circuit board 3e for mounting a light emitting element according to the sixth embodiment, no film of the adhesive 34 is formed between the wiring pattern 32 and the base film 31b. In such a configuration, the wiring pattern 32 can be formed of a copper film with a varnish-like polyimide resin applied thereto and dried and thermally set (that is, an adhesive-less copper clad laminate formed by casting). The flexible circuit board 3e for mounting a light emitting element configured as described above has no film of the adhesive 34 unlike the flexible circuit board 3d for mounting a light emitting element according to the fifth embodiment and therefore can quickly radiate the heat generated by the mounted light emitting element 40 to the base film 31b through the cover film 33a and the wiring pattern.

(Manufacturing Method)

Next, methods of manufacturing the flexible circuit boards 3a to 3e for mounting a light emitting element according to the second to sixth embodiments of the present invention will be described with reference to FIGS. 14A to 20B. The methods of manufacturing the flexible circuit boards 3a to 3e for mounting a light emitting element according to embodiments of the present invention comprise a step of forming openings in the base films 31a and 31b, a step of forming the wiring pattern 32, a step of forming the cover films 33a and 33b, and a step of plating the wiring pattern 32. The method of manufacturing the flexible circuit board 3b for mounting a light emitting element according to the third embodiment further comprises a step of forming the reflecting film 36. In the case where the surface of the cover films 33a and 33b or the reflecting film 36 has irregularities, the methods further comprise a step of forming the irregularities.

The step of forming openings in the base films 31a and 31b and the step of forming the wiring pattern 32 are the same for the methods of manufacturing the flexible circuit boards 3a to 3e for mounting a light emitting element according to embodiments and therefore will be described together. FIGS. 14A to 15D are schematic cross-sectional views for illustrating the step of forming openings in the base films 31a and 31b and the step of forming the wiring pattern 32. Although FIGS. 14A to 15D show the flexible circuit board 3a for mounting a light emitting element according to the second embodiment as an example, the same description holds true for the flexible circuit boards 3b to 3e for mounting a light emitting element according to the third to sixth embodiments. The arrangements incorporating the base film 31a and the arrangements incorporating the base film 31b are manufactured in the same methods. FIGS. 14A to 15B show an arrangement incorporating the base film 31a, as an example.

Figure 14A:
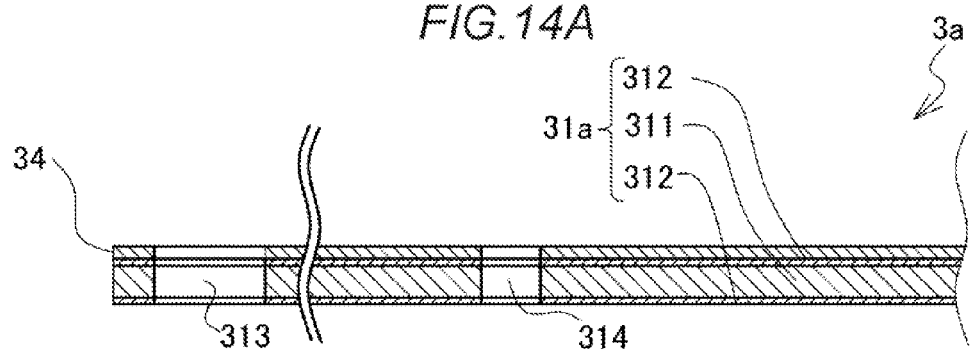
FIG. 14A is a schematic cross-sectional view for illustrating a step of forming an opening in a base film and the first half of a step of forming a wiring pattern in a method of manufacturing flexible circuit boards for mounting a light emitting element according to embodiments of the present invention.

As shown in FIG. 14A, first, openings, such as the sprocket hole 313 and the device hole 314, are formed in the base films 31a and 31b with the thermosetting adhesive 34 applied thereto partially set. The openings can be formed by punching using a die, for example.

Figure 14B:
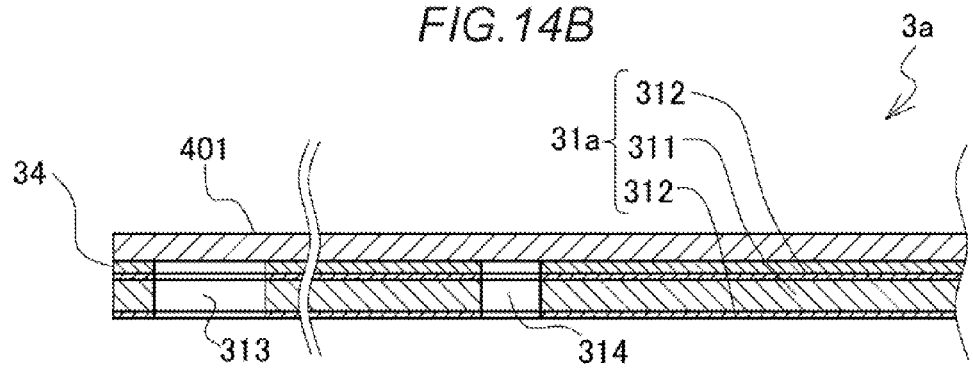
FIG. 14B is a schematic cross-sectional view for illustrating the step of forming an opening in a base film and the first half of the step of forming a wiring pattern in the method of manufacturing flexible circuit boards for mounting a light emitting element according to embodiments of the present invention.

Then, the process proceeds to the step of forming the wiring pattern 32 as shown in FIGS. 14B to 15D. In this step, the wiring pattern 32 is formed on a surface of the base films 31a and 31b. The wiring pattern 32 can be formed by photolithography. More specifically, the wiring pattern 32 is formed as follows. As shown in FIG. 14B, a conductor film 401 is applied onto the base films 31a and 31b with the film of the adhesive 34 formed thereon. The conductor film 401 is to be patterned to form the wiring pattern 32. The conductor film 401 can be applied by thermo-compression bonding (laminating), for example. Then, the thermosetting adhesive 34 between the base films 31a and 31b and the conductor film 401 is set in a curing process. In this way, the conductor film 401 is bonded to the surface of the base films 31a and 31b.

Figure 14C:
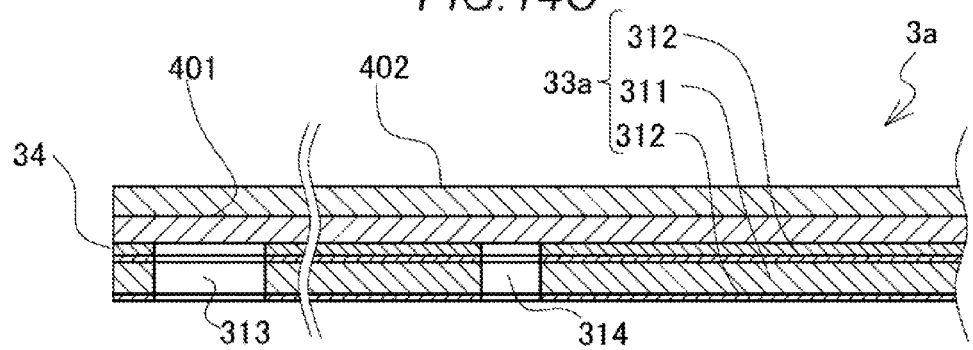
FIG. 14C is a schematic cross-sectional view for illustrating the step of forming an opening in a base film and the first half of the step of forming a wiring pattern in the method of manufacturing flexible circuit boards for mounting a light emitting element according to embodiments of the present invention.
Figure 14D:
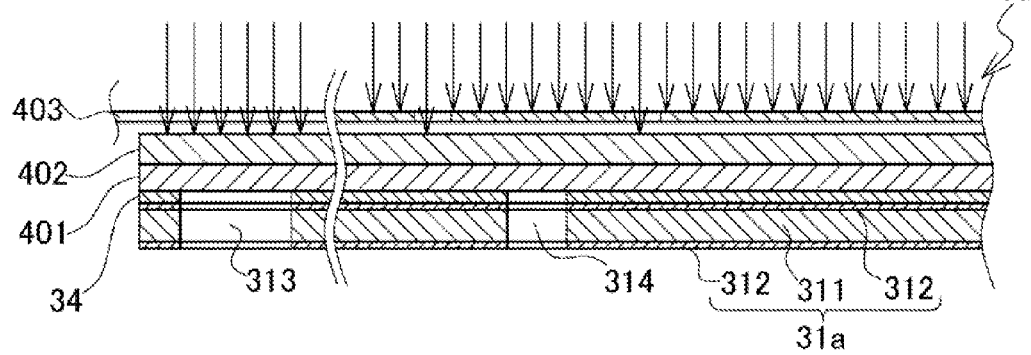
FIG. 14D is a schematic cross-sectional view for illustrating the step of forming an opening in a base film and the first half of the step of forming a wiring pattern in the method of manufacturing flexible circuit boards for mounting a light emitting element according to embodiments of the present invention.

Then, as shown in FIG. 14C, a film of a photoresist 402 is formed on the surface of the conductor film 401. The photoresist 402 is not limited to any particular type and can be any of various well-known photosensitive materials. The film of the photoresist 402 can be formed by various well-known conventional methods. For example, the surface of the conductor film 401 can be coated with the photoresist 402, and then the photoresist 402 can be dried. Then, as shown in FIG. 14D, the formed film of the photoresist 402 is exposed to light. The arrows in the drawing schematically show the optical energy with which the film of the photoresist 402 is irradiated. The exposure can be performed by using a photomask 403 with a predetermined light transmitting part and a predetermined light blocking part and irradiating a predetermined part of the film of the photoresist 402 with the optical energy through the photomask 403. The photoresist 402 may be of the positive type or the negative type. The drawings show an example in which the photoresist 402 is of the positive type.

Figure 15A:
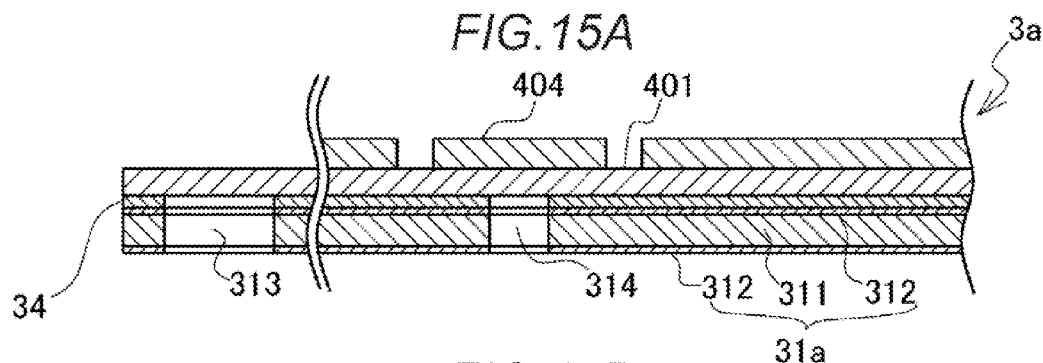
FIG. 15A is a schematic cross-sectional view for illustrating the second half of the step of forming a wiring pattern in the method of manufacturing flexible circuit boards for mounting a light emitting element according to embodiments of the present invention.
Figure 15B:
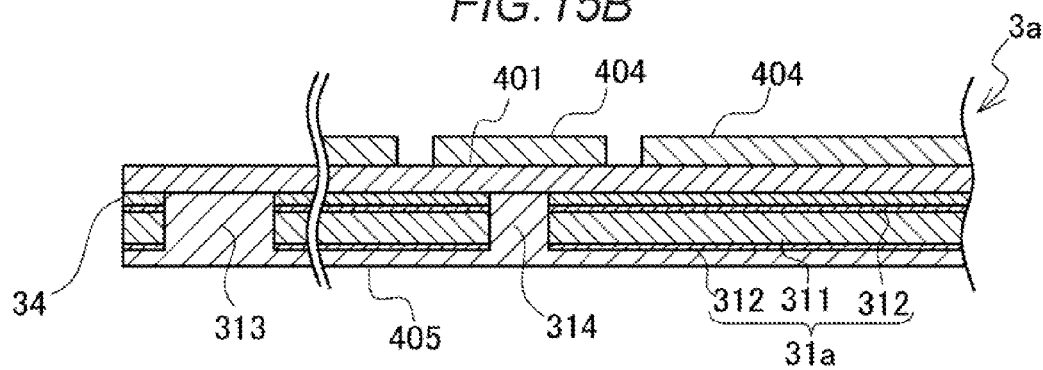
FIG. 15B is a schematic cross-sectional view for illustrating the second half of the step of forming a wiring pattern in the method of manufacturing flexible circuit boards for mounting a light emitting element according to embodiments of the present invention.

Then, as shown in FIG. 15A, the exposed film of the photoresist 402 is developed. By the development, a resist pattern 404 formed by the photoresist 402 is formed on the surface of the conductor film 401. Then, as shown in FIG. 15B, a masking film 405 is formed on the surface opposite to the surface on which resist pattern 404 is formed.

The masking film 405 protects the conductor film 401 in the process of forming the wiring pattern 32 by patterning the conductor film 401 by etching. That is, the masking film 405 prevents the conductor film 401 from being etched through the openings formed in the base films 31a and 31b. In the case where the substrate 311 of the base films 31a is made of a metal material, the masking film 405 protects the substrate 311 of the base film 31a to prevent the substrate 311 from being etched in this step. The masking film 405 can be made of any of various well-known thermosetting etching resists. The masking film 405 can be formed by coating the surface of the base films 31a and 31b with the thermosetting etching resist that is to form the masking film 405 so as to fill the sprocket holes 313 and the device holes 314 as the openings and then setting the thermosetting etching resist by heating, for example, as shown in FIG. 15B.

Figure 15C:
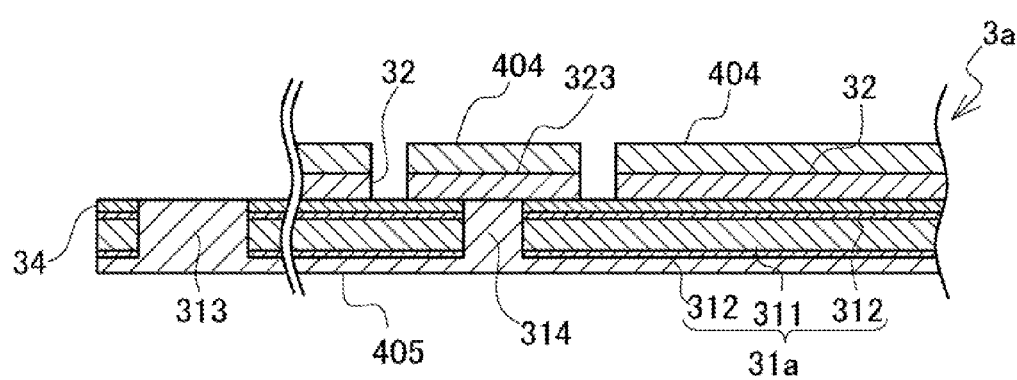
FIG. 15C is a schematic cross-sectional view for illustrating the second half of the step of forming a wiring pattern in the method of manufacturing flexible circuit boards for mounting a light emitting element according to embodiments of the present invention.

Once the masking film 405 is formed, the base films 31a and 31b and the conductor film 401 exposed in the sprocket holes 313 and the device holes 314 as the openings in the base films 31a and 31b are covered with the masking film 405. That is, the openings formed in the base films 31a and 31b are filled with the thermosetting etching resist forming the masking film 405. Then, as shown in FIG. 15C, the conductor film 401 is etched using the resist pattern 404 as an etching mask. By this etching, the conductor film 401 is patterned to form the wiring pattern 32.

Figure 15D:
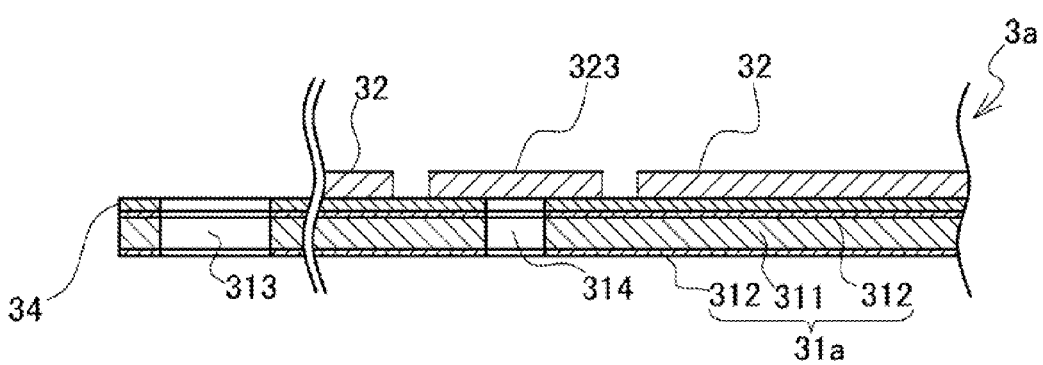
FIG. 15D is a schematic cross-sectional view for illustrating the second half of the step of forming a wiring pattern in the method of manufacturing flexible circuit boards for mounting a light emitting element according to embodiments of the present invention.

Note that since the openings including the device holes 314 are covered with the masking film 405 as described above and shown in FIGS. 15B and 15C, the substrate 311 of the base films 31a and 31b are not etched. That is, the masking film 405 protects the wiring pattern 32 and the substrate 311 of the base film 31a. Once the etching is completed, as shown in FIG. 15D, the resist pattern 404 and the masking film 405 are removed (peeled off). The resist pattern 404 and the masking film 405 can be removed using caustic soda, for example. The wiring pattern 32 is formed by the procedure described above.

Then, the process proceeds to the step of forming the cover films 33a and 33b and the step of forming the reflecting films 36 and 333. In the following, the step of forming the cover films 33a and 33b and the step of forming the reflecting films 36 and 333 in each embodiment will be separately described.

The step of forming the cover film 33a of the flexible circuit board 3a for mounting a light emitting element according to the second embodiment will be described with reference to FIG. 16. FIGS. 16A to 16D are schematic cross-sectional views for illustrating the step of forming the cover film 33a of the flexible circuit board 3a for mounting a light emitting element according to the second embodiment. Note that the step of forming the cover film 33a of the flexible circuit boards 3d and 3e for mounting a light emitting element according to the fifth and sixth embodiments are the same as the step of forming the cover film 33a of the flexible circuit board 3a for mounting a light emitting element according to the second embodiment.

As shown in FIG. 16A, first, the cover film 33a is formed on a surface of the base film 31a and wiring pattern 32. More specifically, the adhesive 35 is applied to the surface of the cover film 33a facing the base film 31a and wiring pattern 32 to bond the cover film 33a to the base film 31a and wiring pattern 32.

For example, the cover film 33a can be a composite sheet previously coated with a film of the adhesive 35. A method of manufacturing the composite sheet will be briefly described. First, using a base and a roll type coater, a solution of the adhesive 35 is applied to a surface of the cover film 33a to form a film of the adhesive 35. The film of the adhesive 35 formed on the cover film 33a is partially set by evaporating the organic solvent with a drier. The conditions for drying with the drier can be appropriately set considering the kind of the adhesive, the thickness of the film or the like. The adhesive 35 can be any of various well-known thermosetting adhesives.

The cover film 33a and the adhesive 35 applied thereto are previously shaped to have a predetermined shape and predetermined dimensions (that is, so as to have the shape and the dimensions of the region to be covered by the cover film 33a) and have the openings 334 previously formed therein. The openings 334 can be formed in the cover film 33a by punching with a die, for example. Then, the cover film 33a having the predetermined shape and the predetermined dimension is positioned on and temporarily bonded to the surface of the base film 31a and wiring pattern 32. Then, the cover film 33a is permanently bonded to the surface with a thermo-compression laminator or the like and then is subjected to afterbaking. In this way, the cover film 33a is bonded to the surface of the base film 31a and wiring pattern 32 at a predetermined position.

Then, irregularities are formed on the surface of the cover film 33a. The irregularities are formed with a transfer mold 406. As shown in FIGS. 16B to 16D, the transfer mold 406 is pressed against the surface of the cover film 33a. The transfer mold 406 comprises a cushion rubber 407 and a glass cloth 408 applied to a surface of the cushion rubber 407.

The glass cloth 408 is a film-shaped member made of a glass fiber. Therefore, the surface of the glass cloth 408 has irregularities determined by the diameter and the pitch of the glass fibers. When the glass cloth 408 is pressed against the cover film 33a, the irregularities on the surface of the glass cloth 408 are transferred to the surface of the cover film 33a. Irregularities having a depth of 15 to 80 µm can be formed on the surface in pitch of 100 to 3000 µm by changing the kind of the glass fiber. Through this step, the cover film 33a comes to have irregularities on the surface and thus have such surface properties as to produce diffuse reflection of light.

The depth and the pitch of the irregularities on the surface of the glass cloth can be appropriately chosen so as to form irregularities that produce diffuse reflection of light on the surface of the cover film 33a. For example, the depth of the irregularities on the surface of the glass cloth 408 can be approximately 200 µm in the longitudinal direction of the glass cloth 408 and approximately 30 µm in the lateral direction of the glass cloth 408, and the pitch of the irregularities can be approximately 2.5 mm. If the transfer mold 406 comprising such a glass cloth 408 is used, irregularities having a depth of approximately 15 µm can be formed on the surface of the cover film 33a, for example. In this way, the cover film 33a comes to have such surface properties as to produce diffuse reflection of light. These numerical values are given for illustrative purposes, and the present invention is not limited to these values. What is essential is that irregularities that produce diffuse reflection of light can be formed on the surface of the cover film 33a. The glass cloth 408 according to this embodiment can be CHUKOH FLO FABRIC (model number: FGF-400-35) manufactured by CHUKOH CHEMICAL INDUSTRIES, LTD. (CHUKOH FLO is a registered trademark of CHUKOH CHEMICAL INDUSTRIES, LTD.), for example.

According to the process of pressing the transfer mold 406 against the cover film 33a, irregularities can be formed on the surface of the cover film 33a without damaging the protective film 332. If a cutting process is used, the protective film 332 is shaved, and shavings or other contaminants are produced, unlike the process of pressing the transfer mold 406 against the cover film 33a. In addition, according to the process of forming irregularities with the transfer mold 406, the deformation of the wiring pattern 32 and the base film 31a can be reduced to a negligible extent.

In the case where the irregularities are not formed on the surface of the cover film 33a (see FIG. 9A), the step described above is not performed.

Then, a curing process is performed. By the curing process, the thermosetting adhesive 35 between the cover film 33a and the base film 31a and wiring pattern 32 is set.

Through the process described above, the cover film 33a is disposed on the surface of the base film 31a and wiring pattern 32.

Then, the nickel-plating film 321 is formed on the exposed wiring pattern 32, and the gold-plating film 322 is formed on the surface of the nickel-plating film 321 (see FIGS. 9A and 9B).

Through the process described above, the flexible circuit board 3a for mounting a light emitting element according to the second embodiment is manufactured.

Next, the step of forming the cover film 33a of the flexible circuit board 3b for mounting a light emitting element according to the third embodiment and the step of forming the reflecting film 36 of the same will be described. The process varies depending on whether the reflecting film 36 is a coating or a film.

Figure 17A:
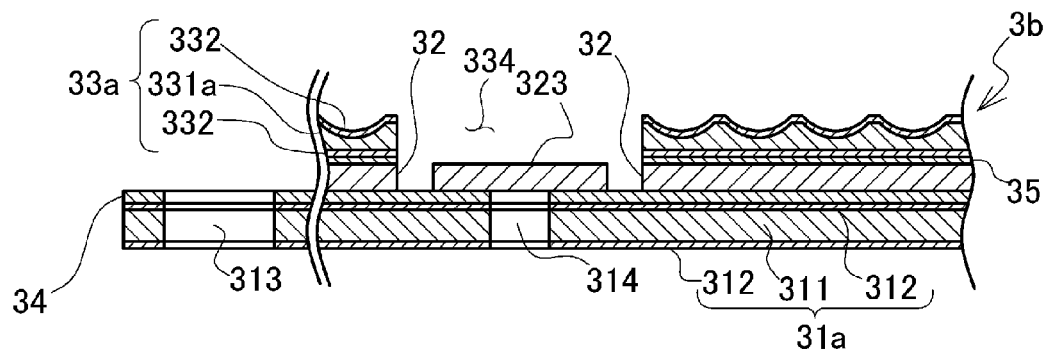
FIG. 17A is a schematic cross-sectional view for illustrating a step of forming a cover film and a step of forming a reflecting film in a case where the reflecting film is made of a solder resist in the method of manufacturing the flexible circuit board for mounting a light emitting element according to the third embodiment of the present invention.
Figure 17B:
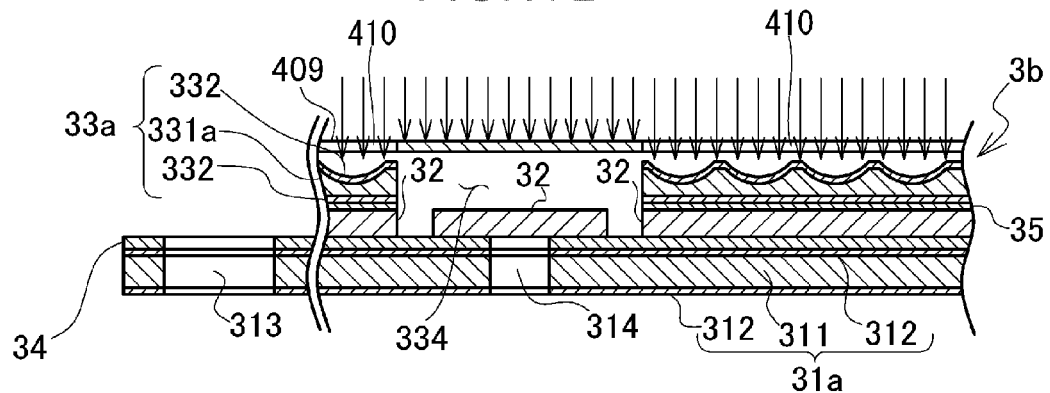
FIG. 17B is a schematic cross-sectional view for illustrating the step of forming a cover film and the step of forming a reflecting film in the case where the reflecting film is made of a solder resist in the method of manufacturing the flexible circuit board for mounting a light emitting element according to the third embodiment of the present invention.
Figure 17C:
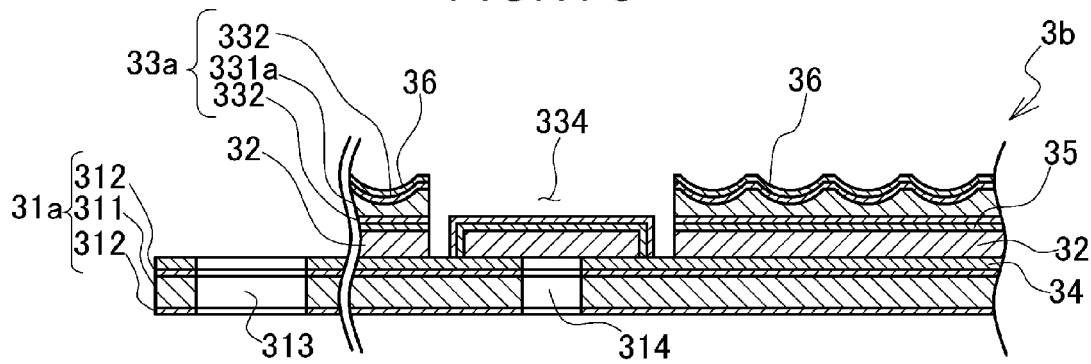
FIG. 17C is a schematic cross-sectional view for illustrating the step of forming a cover film and the step of forming a reflecting film in the case where the reflecting film is made of a solder resist in the method of manufacturing the flexible circuit board for mounting a light emitting element according to the third embodiment of the present invention.

The process in the case where the reflecting film 36 is a coating is as follows. FIGS. 17A to 17C are schematic cross-sectional views for illustrating the step of forming the cover film 33a of the flexible circuit board 3b for mounting a light emitting element according to the third embodiment and the step of forming the reflecting film 36 that is a coating.

As shown in FIG. 17A, the cover film 33a is formed on the surface of the base film 31a and wiring pattern 32. As required, irregularities are formed on the surface of the cover film 33a. This step is the same as the step of forming the cover film 33a of the flexible circuit board 3a for mounting a light emitting element according to the second embodiment. Therefore, descriptions thereof will be omitted.

Then, as shown in FIG. 17B, a mask 409 is disposed over the surface of the base film 31a with the cover film 33a formed thereon. The mask 409 has an opening 410 at a part where the reflecting film 36 is to be formed and is filled at the other parts. Then, a substantially white solder resist yet to be set is sprayed onto the surface of the cover film 33a through the mask 409. The arrows in the drawing schematically show the sprayed solder resist. Then, the sprayed solder resist is set. Through the process described above, the reflecting film 36 is formed on the surface of the cover film 33a as shown in FIG. 17C. According to this process, the reflecting film 36 having a uniform small thickness can be formed. Therefore, the surface of the reflecting film 36 can conform to the shape of the surface of the cover film 33a. If silk-screen printing is used, for example, the resulting reflecting film 36 is thick. Then, the irregularities formed on the surface of the cover film 33a are filled by the reflecting film 36, and the surface of the reflecting film 36 is substantially planar. To the contrary, according to the process of forming the reflecting film 36 by spraying, the resulting reflecting film can have a uniform small thickness. Therefore, the surface of the reflecting film 36 can conform to the shape of the surface of the cover film 33a. According to this process, the reflecting film 36 having irregularities on the surface can be formed.

Although FIGS. 17A to 17C show a configuration in which irregularities are formed on the surface of the cover film 33a, the same process can be used to form the reflecting film 36 even if the irregularities are not formed on the surface of the cover film 33a.

Then, the nickel-plating film 321 and the gold-plating film 322 are formed on the exposed wiring pattern 32 (see FIGS. 10A and 10B). This process is the same as in the case of the flexible circuit board 3a for mounting a light emitting element according to the second embodiment.

Figure 18A:
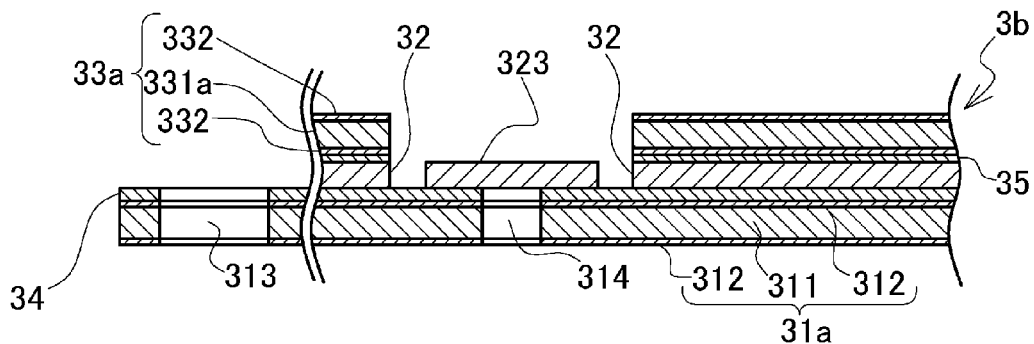
FIG. 18A is a schematic cross-sectional view for illustrating the step of forming a cover film and the first half of the step of forming a reflecting film in a case where the reflecting film is made of a film in the method of manufacturing the flexible circuit board for mounting a light emitting element according to the third embodiment of the present invention.
Figure 18B:
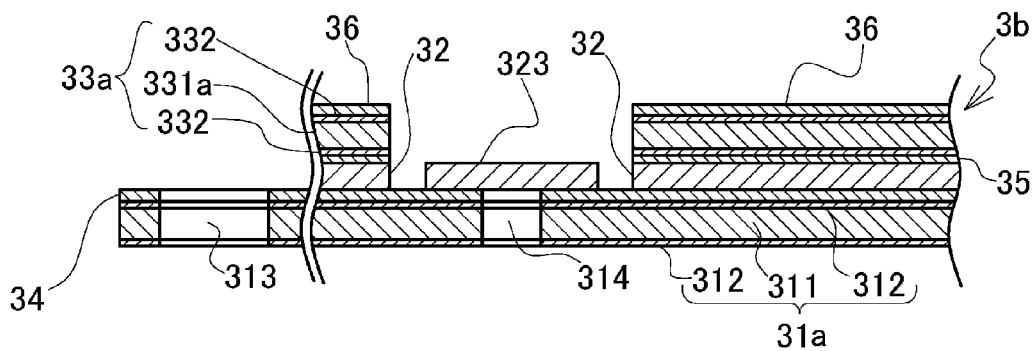
FIG. 18B is a schematic cross-sectional view for illustrating the step of forming a cover film and the first half of the step of forming a reflecting film in the case where the reflecting film is made of a film in the method of manufacturing the flexible circuit board for mounting a light emitting element according to the third embodiment of the present invention.

On the other hand, the process in the case where the reflecting film 36 is a film is as follows. FIGS. 18A to 19B are schematic cross-sectional views for illustrating the step of forming the cover film 33a and the step of forming the reflecting film 36 in the case where the reflecting film 36 is a film. First, as shown in FIG. 18A, the cover film 33a is applied to the surface of the base film 31a and wiring pattern 32. This process is the same as that in the second embodiment. Then, as shown in FIG. 18B, a film that serves as the reflecting film 36 is applied to the surface of the cover film 33a. This process is the same as the process of applying the cover film 33a in the second embodiment except for that the object to which the film is applied is different.

In the case where irregularities are not formed on the surface of the reflecting film 36, then, a curing process is performed. By this curing process, the thermosetting adhesive 35 between the cover film 33a and the base film 31a and wiring pattern 32 is set. In the case where the film serving as the reflecting film 36 is also bonded by a thermosetting adhesive, the adhesive to bond the reflecting film 36 to the cover film 33a is also set in this curing process.

Figure 18C:
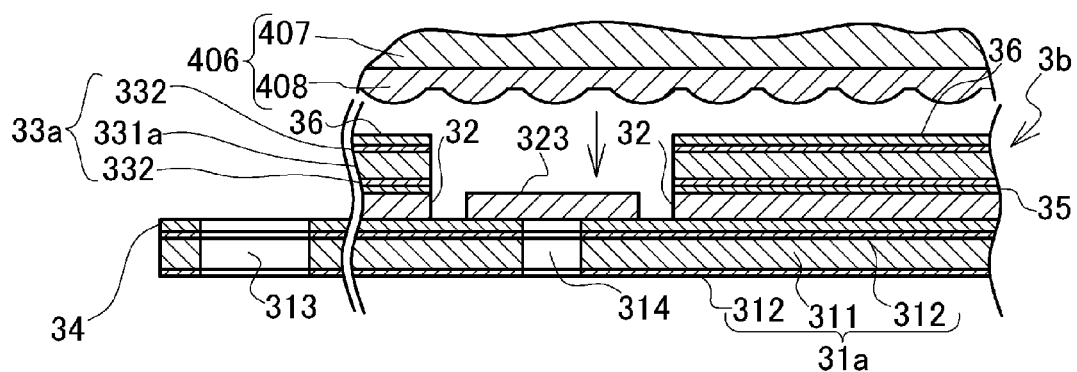
FIG. 18C is a schematic cross-sectional view for illustrating the step of forming a cover film and the first half of the step of forming a reflecting film in the case where the reflecting film is made of a film in the method of manufacturing the flexible circuit board for mounting a light emitting element according to the third embodiment of the present invention.
Figure 19A:
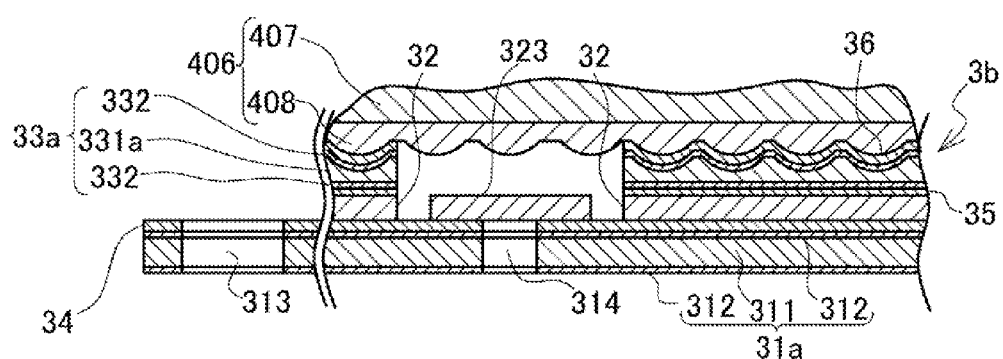
FIG. 19A is a schematic cross-sectional view for illustrating the step of forming a cover film and the second half of the step of forming a reflecting film in the case where the reflecting film is made of a film in the method of manufacturing the flexible circuit board for mounting a light emitting element according to the third embodiment of the present invention.
Figure 19B:
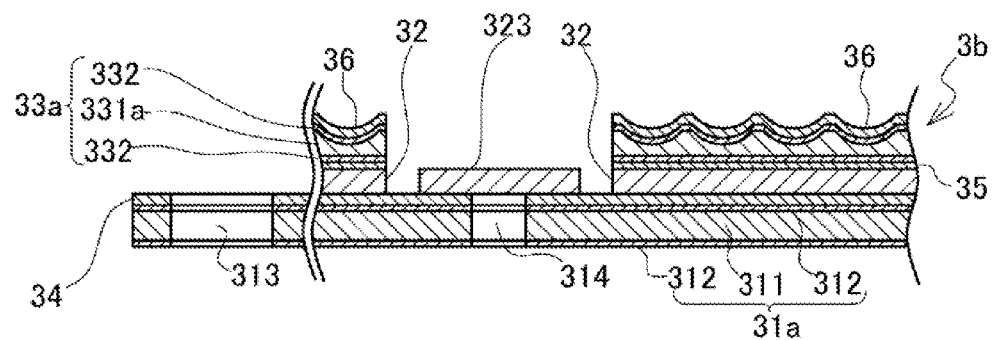
FIG. 19B is a schematic cross-sectional view for illustrating the step of forming a cover film and the second half of the step of forming a reflecting film in the case where the reflecting film is made of a film in the method of manufacturing the flexible circuit board for mounting a light emitting element according to the third embodiment of the present invention.

In the case where irregularities are formed on the surface of the reflecting film 36, the irregularities are formed in advance of the curing process. The irregularities can be formed by pressing the transfer mold 406 against the surface of the reflecting film 36 as shown in FIGS. 18C and 19A. The configuration of the transfer mold 406 has already been described. When the transfer mold 406 is pressed against the reflecting film 36, the irregularities on the surface of the glass cloth 408 are transferred to the surface of the reflecting film 36. Through this process, the irregularities are formed on the surface of the reflecting film 36 as shown in FIG. 19B. Then, the curing process is performed.

In this way, the cover film 33a is disposed on the surface of the base film 31a and wiring pattern 32, and the reflecting film 36 is disposed on the surface of the cover film 33a.

Then, the nickel-plating film 321 is formed on the exposed wiring pattern 32, and the gold-plating film 322 is formed on the surface of the nickel-plating film 321 (see FIGS. 10A and 10B).

Through the process described above, the flexible circuit board 3b for mounting a light emitting element according to the third embodiment is manufactured.

Next, the step of forming the cover film 33b of the flexible circuit board 3c for mounting a light emitting element according to the fourth embodiment will be described with reference to FIGS. 20A and 20B. FIGS. 20A and 20B are schematic cross-sectional views for illustrating the step of forming the cover film 33b of the flexible circuit board 3c for mounting a light emitting element according to the fourth embodiment.

As shown in FIG. 20A, first, the cover film 33b is formed on the surface of the base film 31a and wiring pattern 32. For example, first, the adhesive 35 is applied to the surface of the cover film 33b facing the base film 31a and wiring pattern 32. Then, the cover film 33b is bonded to the surface of the base film 31a and wiring pattern 32 by the applied adhesive 35. The adhesive 35 can be any of various well-known thermosetting adhesives, for example. The cover film 33b has a laminate structure comprising the film-shaped substrate 331b and the reflecting film 333 formed on its surface. The substrate 331b is made of a resin material. The reflecting film 333 can be a film containing titanium oxide. The cover film 33b and the adhesive 35 applied thereto are previously shaped to have a predetermined shape and predetermined dimensions (that is, so as to have the shape and the dimensions of the region to be covered by the cover film 33b) and have the openings 334 previously formed therein.

Then, the cover film 33b is positioned on and bonded to the surface of the base film 31a and wiring pattern 32. For example, the cover film 33b is bonded by thermo-compression bonding. Then, the thermosetting adhesive between the cover film 33b and the base film 31a and wiring pattern 32 is set in a curing process. In this way, the cover film 33b is bonded to the surface of the base film 31a and wiring pattern 32.

Then, as shown in FIG. 20B, the nickel-plating film 321 is formed on the exposed wiring pattern 32, and the gold-plating film 322 is formed on the surface of the nickel-plating film 321. This process is the same as in the case of the flexible circuit board 3a for mounting a light emitting element according to the second embodiment.

The step of forming the cover film 33a of the flexible circuit boards 3d and 3e for mounting a light emitting element according to the fifth and sixth embodiments and the step of plating the wiring pattern 32 of the same are the same as those of the flexible circuit board 3a for mounting a light emitting element according to the second embodiment. Therefore, descriptions thereof will be omitted.

The flexible circuit boards 3a to 3e for mounting a light emitting element according to embodiments of the present invention have the following advantages.

The base film 31a and the cover film 33a have the substrates 311 and 331a made of a metal material, respectively. Metal materials have higher thermal conductivities than resin materials, so that the heat generated by the mounted light emitting element 40 can be quickly radiated. Therefore, the properties of the light emitting element 40 can be prevented from being deteriorated by heat.

The surface of the cover film 33*a* produces specular reflection or diffuse reflection of light. As an alternative, the substantially white reflecting films 36 and 333 are formed on the surface of the cover films 33*a* and 33*b*. With such a configuration, more of the light emitted by the light emitting element 40 can be reflected rather than absorbed. Therefore, the light emitted by the light emitting element 40 can be efficiently used.

As the white pigment forming the white reflecting layer of the reflecting film 36 or 333, other inorganic pigments than titanium oxide, such as calcium carbonate, magnesium carbonate, zinc oxide and magnesium oxide can also be used to enhance the diffuse reflection of light and increase the amount of reflected light. The film containing titanium oxide described above is required to be made of a resin containing the white pigment described above that can be applied to a polyimide film and dried and set and is highly adhesive. As such a resin, silicone resins or polyurethane resins are preferably used.

As described above, the flexible circuit boards 3*a* to 3*e* for mounting a light emitting element according to embodiments of the present invention can prevent the temperature of the mounted light emitting element 40 from increasing and allow efficient use of the light emitted by the light emitting element 40.

Furthermore, the number of light emitting elements 40 mounted on the flexible circuit boards 3*a* to 3*e* for mounting a light emitting element according to embodiments can be reduced, and the cost can be reduced. For example, with the configuration in which the surface of the cover films 33*a* and 33*b* or the reflecting films 36 and 333 have no irregularities, the light emitted by the light emitting element 40 is specularly reflected or diffuse-reflected by the surface of the cover film 33*a* or the reflecting films 36 and 333. Therefore, the amount of light wasted can be reduced, and the light emitted by a light source incorporating the flexible circuit boards 3*a* to 3*e* for mounting a light emitting element according to embodiments can be efficiently used.

Therefore, the number of light emitting elements 40 mounted on the flexible circuit boards 3*a* to 3*e* for mounting a light emitting element according to embodiments can be reduced. On the other hand, with the configuration in which the surface of the cover film 33*a* or the reflecting films 36 and 333 have irregularities, the light emitted by the light emitting element 40 is diffuse-reflected by the surface of the cover film 33*a* or the reflecting films 36 and 333 and becomes less directive, so that the nonuniformity of the in-plane light intensity distribution is reduced. Thus, the plurality of LEDs mounted on the flexible circuit boards 3*a* to 3*e* for mounting a light emitting element according to embodiments can be arranged at greater intervals, and therefore, the number of light emitting elements 40 can be reduced.

Metal materials, such as aluminum, are inexpensive compared with resin materials, such as polyimide. Therefore, if at least one of the base film 31*a* and the cover film 33*a* is made of a metal material, the parts cost can be reduced compared with the configuration in which both films are made of a resin material. For this reason, a reduction in product price can be achieved.

Seventh Embodiment

With the flexible circuit boards 3*a*, 3*b*, 3*d* and 3*e* for mounting a light emitting element according to the second, third, fifth and sixth embodiments described above, the cover film 33*a* comprises the substrate 331*a* made of a metal. Therefore, the flexible circuit boards 3*a*, 3*b*, 3*d* and 3*e* for mounting a light emitting element have a problem that the film of the adhesive 35, which is an insulating layer, is disposed between the substrate 331*a* made of a metal material and the wiring pattern 32 formed by a copper foil, and a parasitic stray capacitance is formed between them to make the circuit operation unstable. To solve the problem, a wire in the wiring pattern 32 that is at the ground potential (referred to as a grounding wire 39, hereinafter) can be electrically connected to the substrate 331*a* made of a metal material at an appropriate part. A similar measure is needed for the substrate 311 of the base film and the wiring pattern 32. Next, this measure will be described as an embodiment.

A flexible circuit boards 3*f* and 3*g* for mounting a light emitting element according to a seventh embodiment has a structure in which at least one of the substrate 331*a*, which is made of a metal, of the cover film 33*a* and the substrate 311, which is made of a metal, of the base film 31*a* is electrically connected to the grounding wire 39 in the wiring pattern 32. In short, at least one of the substrate 331*a* of the cover film 33*a* and the substrate 311 of the base film 31*a* is connected to be at the same potential as the grounding wire 39. In the following, configurations according to this embodiment will be described with reference to FIGS. 21A to 22B.

FIG. 21A is a schematic cross-sectional view showing a configuration of the flexible circuit board 3*f* for mounting a light emitting element according to an example of the seventh embodiment. The flexible circuit board 3*f* for mounting a light emitting element according to this embodiment of the seventh embodiment is the flexible circuit board 3*a* for mounting a light emitting element according to the second embodiment in which a through-hole 38 that penetrates the cover film 33*a*, the grounding wire 39 and the base film 31*a* is formed and filled with a conductive paste 37 that electrically connects the grounding wire 39, the substrate 311 of the base film and the substrate 331*a* of the cover film to each other.

Manufacturing will be described below in detail. First, the through-hole 38 (a circular hole) having a diameter of 1.0 mm is formed in the flexible circuit board 3*a* for mounting a light emitting element according to the second embodiment with a guide hole punching machine. Then, the through-hole 38 is filled with the conductive paste (conductive silver paste SV manufactured by Harima Chemicals Group, Inc.) 37 by printing, and the conductive paste 37 is hardened in a predetermined manner. The surface of the conductive paste 37 exposed from the through-hole 38 is preferably planed to be substantially flush with the surface of the surrounding base film 31*a* or the cover film 33*a* and then coated with an insulating resin for insulation.

The grounding wire 39 is a wire to drive the light emitting element 40 and has a width of approximately 1.5 mm. From consideration of the heat radiating effect and the shielding effect, one through-hole 38 may be formed for each set of several light emitting elements 40.

FIG. 21B is a schematic cross-sectional view showing a configuration of the flexible circuit board 3*f* for mounting a light emitting element according to of the seventh embodiment. The flexible circuit board 3*f* for mounting a light emitting element according to this alternative embodiment is manufactured in a different manufacturing method than the method of manufacturing the flexible circuit board 3*f* for mounting a light emitting element shown in FIG. 21A described above.

The method of manufacturing the flexible circuit board 3*f* for mounting a light emitting element according to this alternative embodiment is as follows. A through-hole 381 and a through-hole 382 are machined in the cover film 33*a* and the base film 31*a*, respectively, at positions corresponding to a predetermined part of the grounding wire 39. The machining is performed using an aluminum etchant if the substrates 311 and 331a are made of aluminum.

Furthermore, the protective film 332 of the cover film and the adhesive 34 is shaved to expose the grounding wire 39 to finish the through-holes 381 and 382. Then, the through-holes 381 and 382 are filled with the conductive paste 37 by printing, and the filled conductive paste 37 is hardened in a predetermined thermosetting manner. In this way, the substrate 331a of the cover film, the substrate 311 of the base film and the grounding wire 39 are electrically connected to each other. This alternative example shown in FIG. 21B does not involve the hole machining in the grounding wire 39, so that the electrical connection can be easily formed even if the grounding wire 39 is a fine line.

As a method of manufacturing the flexible circuit board 3f for mounting a light emitting element shown in FIG. 21B, the following method is also preferred from the viewpoint of mass production. According to the method, the through-hole 381 is formed in the cover film 33a coated with the adhesive 35 at a position corresponding to the grounding wire 39 in the step of forming the opening 334 described in the second embodiment in the same process as the process of forming the opening 334. Furthermore, the through-hole 382 is formed in the base film 31a coated with the adhesive 34 at a position corresponding to the grounding wire 39 in the step of forming the device hole 314 in the same process as the process of forming the device hole 314. The flexible circuit board 3f for mounting a light emitting element is formed of the resulting cover film 33a and base film 31a in the method described in the second embodiment. Then, the electrical connection in the through-holes 381 and 382 can be formed by the conductive paste 37 to complete the flexible circuit board 3f for mounting a light emitting element. This manufacturing method is suitable for mass production because the through-holes 381 and 382 are formed in the process of forming the opening 334 and the device hole 314 described above, and therefore the number of machining steps does not significantly increase.

The embodiments described above can be readily applied to the structure in which the surface of the cover film 33a has irregularities shown in FIG. 9B.

FIG. 22A is a schematic cross-sectional view showing a configuration of the flexible circuit board 3g for mounting a light emitting element according to a third alternative embodiment of the seventh embodiment. The flexible circuit board 3g for mounting a light emitting element according to this alternative embodiment of the seventh embodiment is the flexible circuit board 3b for mounting a light emitting element according to the third embodiment in which the grounding wire 39, the substrate 311 of the base film and the substrate 331a of the cover film are electrically connected to each other. A method of manufacturing the flexible circuit board 3g for mounting a light emitting element is based on the method of manufacturing the flexible circuit board 3f for mounting a light emitting element shown in FIG. 21A and further comprises the step of forming the reflecting film 36 according to the third embodiment in the method described above with reference to FIG. 17B. The surface of the conductive paste 37 filling the through-hole 38 exposed from the cover film is covered with the substantially white reflecting film 36 or the like formed thereon. The flexible circuit board 3g for mounting a light emitting element according to the third alternative embodiment can be easily manufactured in this method.

FIG. 22B is a schematic cross-sectional view showing a configuration of a flexible circuit board 3h for mounting a light emitting element according to a fourth alternative embodiment of the seventh embodiment. The flexible circuit board 3h for mounting a light emitting element according to this alternative embodiment is the flexible circuit board 3d for mounting a light emitting element according to the fifth embodiment of the present invention in which the grounding wire 39 and the substrate 331a of the cover film are electrically connected to each other. A method of manufacturing the flexible circuit board 3h for mounting a light emitting element is based on the method of manufacturing the flexible circuit board 3d for mounting a light emitting element according to the fifth embodiment shown in FIGS. 12A and 12B and further comprises a step of forming the through-hole 381 that reaches the grounding wire 39 in the cover film 33a. The same method as that for the through-hole 381 shown in FIG. 21B can be used to form the through-hole 381 and fill the through-hole 381 with the conductive paste and harden the conductive paste. In this way, the flexible circuit board 3h for mounting a light emitting element can be completed. Of course, the structure and the manufacturing method can also be applied to the flexible circuit board 3e for mounting a light emitting element according to the sixth embodiment. The flexible circuit board 3f for mounting a light emitting element shown in FIG. 21B without the through-hole 382 can have this configuration, in which the through-hole 381 formed in the cover film 33a is used to connect only the substrate 331a made of a metal material and the grounding wire 39 to each other.

Eighth Embodiment

An embodiment of a eighth embodiment of a capsule endoscope 501, which is an electronic apparatus incorporating an LED illuminator 500 comprising a plurality of light emitting elements mounted on any of the flexible circuit boards 3a to 3h for mounting a light emitting element (denoted by reference symbol 3x hereinafter) according to the above-described embodiments of the present invention having a surface with a high reflectance.

Figure 23:
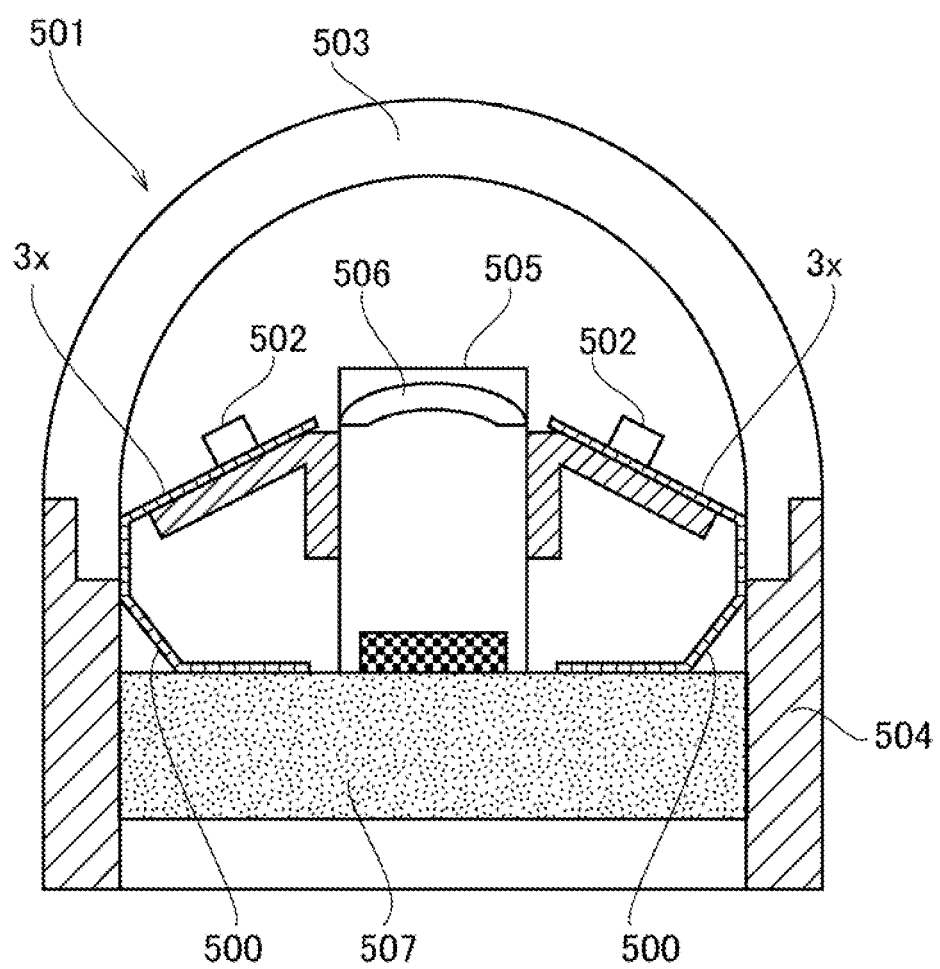
FIG. 23 is a schematic cross-sectional view showing a configuration of a capsule endoscope according to an embodiment of the present invention.

FIG. 23 is a schematic cross-sectional view showing a configuration of the capsule endoscope 501 according to this embodiment of the present invention. The capsule endoscope 501 has a hermetic container comprising a transparent dome 503 and a cylindrical main body 504. An endoscope camera 505 having a substantially cylindrical shape is mounted on a support table 507 at the center in the transparent dome 503. The LED illuminator 500 having a plurality of light emitting elements 502 (LED) is firmly fixed to the support table 507 in such a manner that the light emitting elements 502 surround a lens part 506 of the endoscope camera 505. The LED illuminator 500 comprises the flexible circuit board 3x for mounting a light emitting element according to any of the above-described embodiments of the present invention. With such a configuration, because of its high surface reflectance characteristics, the light emitted by the light emitting elements 502 can be efficiently reflected toward the transparent dome. Furthermore, the heat generated by the light emitting elements 502 can be transferred to the support table 507. Furthermore, the flexible circuit board 3x for mounting a light emitting element has a superior electromagnetic shielding capability and therefore can effectively reduce the effect of electromagnetic noise on the image information acquired by the endoscope camera in which a high frequency signal processing occurs.

Ninth Embodiment

According to a ninth embodiment, an LED illuminator 530 comprising one large light emitting element 532 mounted on the flexible circuit board 3x for mounting a light emitting element is incorporated in a vehicle lighting apparatus 531.

Figure 24:
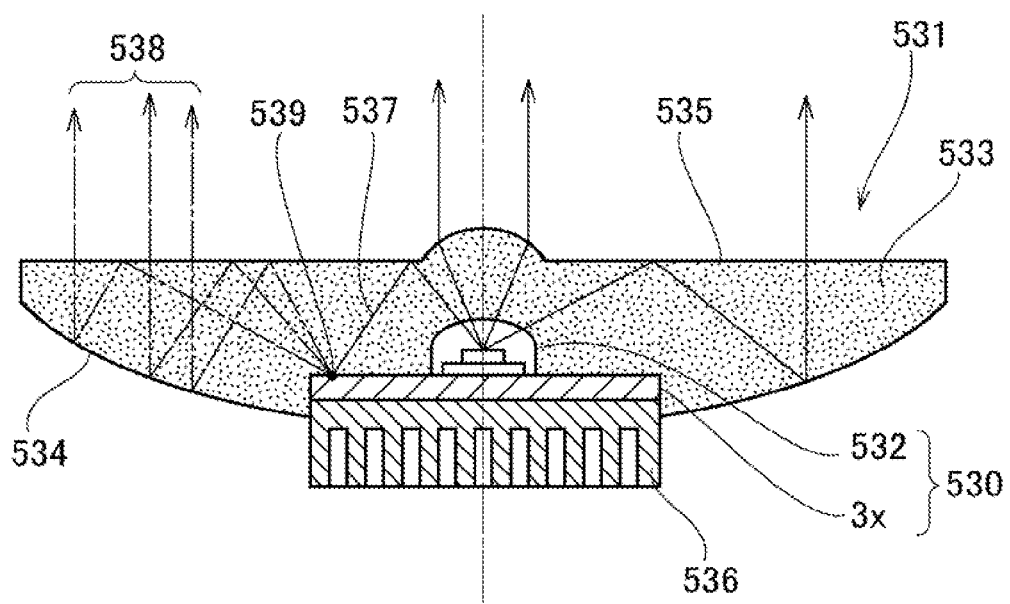
FIG. 24 is a schematic cross-sectional view showing a configuration of a vehicle lighting apparatus according to an embodiment of the present invention.

FIG. 24 is a schematic cross-sectional view showing a configuration of the vehicle lighting apparatus 531 according to this embodiment of the present invention. The vehicle lighting apparatus 531 according to this embodiment of the present invention is designed to direct the light emitted by the light emitting element 532 mounted in the LED illuminator 530 toward the front of the vehicle lighting apparatus 531 by the action of a transparent member 533 disposed in front of the LED illuminator 530. The LED illuminator 530 comprises the flexible circuit board 3x for mounting a light emitting element according to any of the above-described embodiments of the present invention having a high surface reflectance. Therefore, for example, a ray of light 537, which is part of the light emitted by the light emitting element 502, is reflected by a front surface 535 of the transparent member 533 and reaches a point 539 on the surface of the flexible circuit board 3x for mounting a light emitting element or a back surface 534 of the transparent member 533. The ray of light 537 is diffuse-reflected at the point 539 or the back surface 534 of the transparent member 533 and travels in the form of diffuse-reflected light 538 and then can exit the transparent member 533. The heat generated by the light emitting element 532 can be efficiently transferred to a heat sink 536 through the flexible circuit board 3x for mounting a light emitting element having the substrate 331a made of a metal material.

As described above, the capsule endoscope 501 according to the eighth embodiment and the vehicle lighting apparatus 531 according to the ninth embodiment has the LED illuminator incorporating the flexible circuit board 3x for mounting a light emitting element according to any of the embodiments of the present invention. The capsule endoscope 501 and the vehicle lighting apparatus 531 are electronic apparatuses that have a high surface reflectance and a high heat radiation capability owing to the flexible circuit board 3x for mounting a light emitting element according to any of the embodiments of the present invention and are less affected by electromagnetic noise.

Tenth Embodiment

Figure 25:
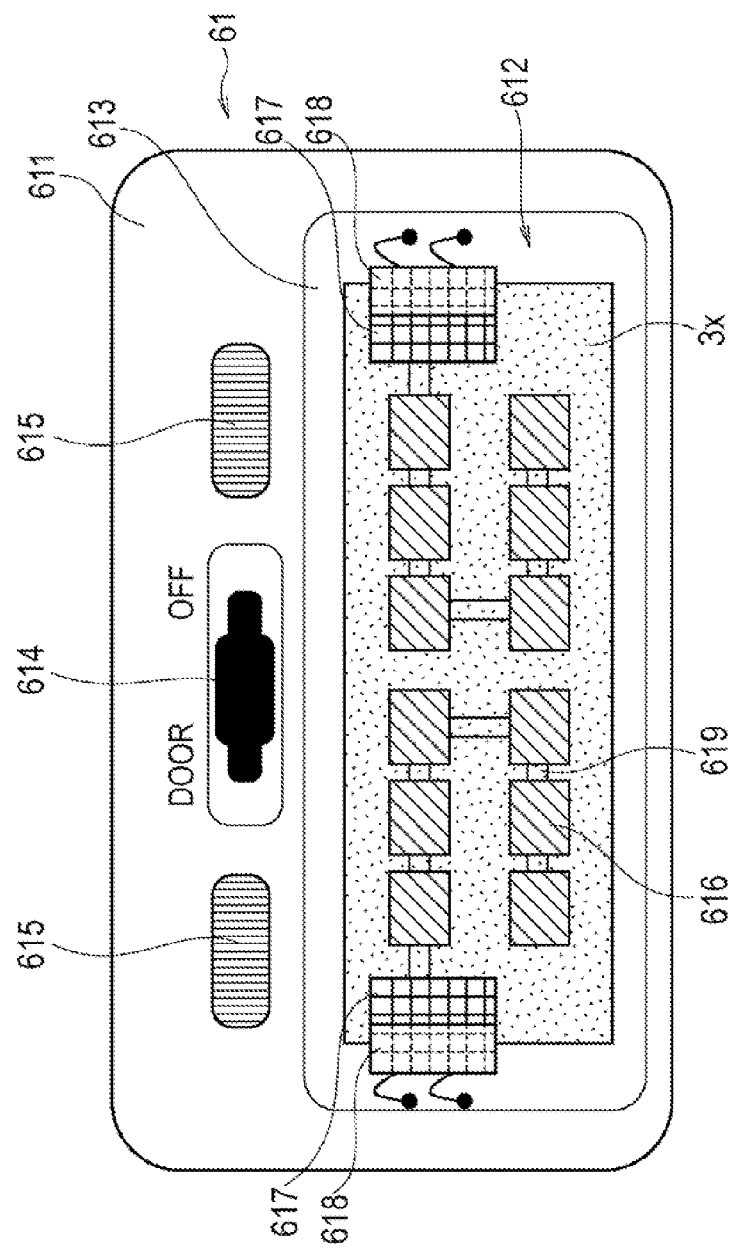
FIG. 25 is a schematic plain view showing a configuration of a vehicle lighting apparatus according to an embodiment of the present invention.

According to a tenth embodiment, an LED illuminator is incorporated in a vehicle lighting apparatus. FIG. 25 is a schematic plan view showing an example of a configuration of a vehicle lighting apparatus 61 according to this embodiment. The vehicle lighting apparatus 61 according to this embodiment is a front room lamp of an automobile. The vehicle lighting apparatus 61 (front room lamp) is installed on a forward part of the ceiling of the interior of an automobile at a substantially laterally central position.

As shown in FIG. 25, the vehicle lighting apparatus 61 according to this embodiment comprises a housing 611, an LED illuminator 612, a lamp cover 613, a switch 614, and two ON/OFF switches 615. The LED illuminator 612 is attached to the housing 611, and the lamp cover 613 is also attached to the housing 611 so as to cover the LED illuminator 612.

The LED illuminator 612 comprises the flexible circuit board 3x for mounting a light emitting element according to any of the embodiments of the present invention and a plurality of LEDs 616 and two power-supplying connectors 617 mounted on the flexible circuit board 3x. The plurality of LEDs 616 are divided into two groups: a group for illuminating the driver's seat side, and a group for illuminating the passenger's seat side. Each of the two power-supplying connectors 617 is connected to an associated one of two power-supplying connectors 618 provided in the housing 611 and thus can receive electricity from the outside. An independent circuit pattern 619 for supplying power to LED 616 is provided to supply electricity to each of the two groups of LEDs. That is, the LEDs 616 of each group receive electricity from the outside via the associated power-supplying connector 617 and are thereby turned on.

The switch 614 is used to switch the LED illuminator 61 among an ON state, an OFF state and a door-interlocked state. The two ON/OFF switches 615 allow separate and independent turning on and off of the group of LEDs 616 for illuminating the driver's seat side and the group of LEDs 616 for illuminating the passenger's seat side.

Eleventh Embodiment

Figure 26:
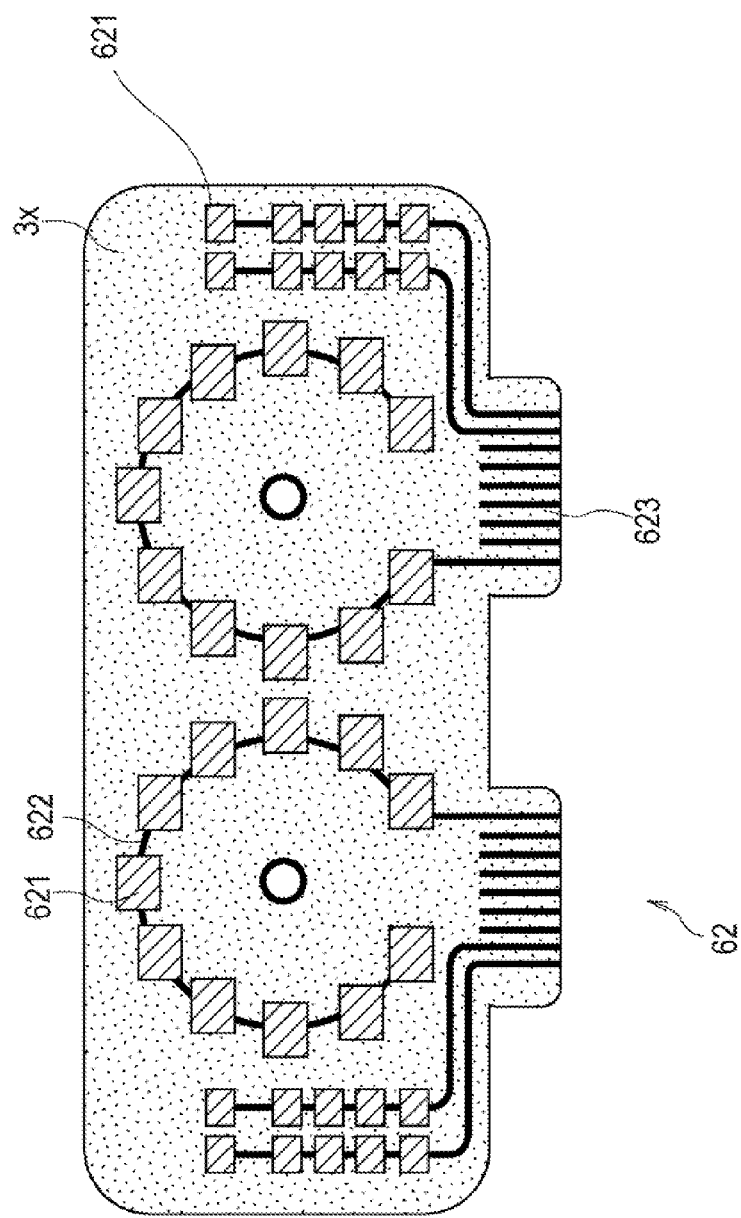
FIG. 26 is a schematic plain view showing a configuration of a vehicle lighting apparatus according to an embodiment of the present invention.

According to an eleventh embodiment, an LED illuminator is incorporated in a vehicle lighting apparatus 62. FIG. 26 is a schematic plan view showing an example of a configuration of the vehicle lighting apparatus 62 according to this embodiment. The vehicle lighting apparatus 62 according to this embodiment is a panel illuminator used for illuminating a meter panel of an automobile. The vehicle lighting apparatus 62 (panel illuminator) is installed on the back surface of a meter panel of an automobile, and the light transmitted through the meter panel makes the display of the meter panel visible.

FIG. 26 is a schematic plan view showing an example of a configuration of the vehicle lighting apparatus 62 (panel illuminator) according to this embodiment. The vehicle lighting apparatus 62 comprises the flexible circuit board 3x for mounting a light emitting element according to any of the embodiments of the present invention and a plurality of LEDs 621 mounted on the flexible circuit board 3x. The flexible circuit board 3x for mounting a light emitting element is provided with a terminal part (land) 623 that receives electricity from the outside and a wiring pattern 622 that feeds the electricity supplied via the terminal part 623 to each LED 621. The number and mounting positions of the LEDs 621 and the wiring pattern 622 are not particularly limited but can be appropriately determined depending on the specifications of the meter panel (the positions of the indicators to be made visible, for example). It is essential only that the vehicle lighting apparatus 62 is configured so that the terminal part 623 can receive electricity from the outside, and the wiring pattern 622 can feed the electricity supplied from the outside to each LED 621.

Advantages of the configurations of the vehicle lighting apparatuses 61 and 62 incorporating the flexible circuit board 3x for mounting a light emitting element according to any of the embodiments of the present invention will be now described.

Since resin materials have low thermal conductivities, if the base film is made of a resin material, the heat generated by the mounted LEDs is not effectively radiated. Therefore, the temperature of the LEDs easily increases. To prevent the increase of the temperature of the LEDs, the value of the current flowing through each LED needs to be small. Then, however, the amount of light emitted by each LED cannot be large, and therefore, a large number of LEDs need to be mounted.

On the other hand, according to this embodiment, the heat generated by the mounted LEDs can be more efficiently radiated than the configuration in which the base film that does not have a substrate made of a metal material, since metal materials have higher thermal conductivities than resin materials. Therefore, the thermal load on the LEDs 616 and 621 can be eliminated or reduced. In addition, the value of the current flowing through the LEDs 616 and 621 can be increased to increase the amount of light emission, thereby reducing the number of the mounted LEDs 616 and 621.

When the LED illuminator 612 is attached to the housing 611 or the like, the flexible circuit board 3x for mounting a light emitting element may need to be bent depending on the shape of the housing 611 or the like. The base film having a substrate made of a metal material has a smaller elastic region and can be more easily plastically deformed than the base film having a substrate made of a resin material. Therefore, the flexible circuit board 3x for mounting a light emitting element bent to conform with the shape of the housing 611 or the like does not tend to return to its original shape (that is, has a small restoring force) but tends to keep the bent shape. As a result, the flexible circuit board 3x does not need to be firmly fixed to the housing 611 or the like. For example, the flexible circuit board 3x can be fixed to the housing 611 or the like by means of a double-faced tape, without using a screw or the like. Thus, the number of manufacturing steps can be reduced.

The vehicle lighting apparatuses 61 and 62 according to the tenth and eleventh embodiments have the same advantages as the vehicle lighting apparatus 531 according to the ninth embodiment. Similarly, the vehicle lighting apparatus 531 according to the ninth embodiment has the same advantages as the vehicle lighting apparatuses 61 and 62 according to the tenth and eleventh embodiments.

Although embodiments of the present invention have been described above in detail, the embodiments described above are intended only to illustrate specific implementations of the present invention. These embodiments should not be construed as limiting the technical scope of the present invention. In other words, the present invention can have various other embodiments without departing from the technical spirit and primary characteristics thereof.

For example, although the embodiments described above concern TAB flexible circuit boards with sprocket holes formed in the base film, the present invention can equally be applied to other flexible circuit boards than the TAB flexible circuit boards. Furthermore, although the embodiments described above concern flexible circuit boards, the present invention can equally be applied to circuit boards having no flexibility (so-called rigid circuit boards).

According to the present invention, the temperature of the mounted light emitting elements can be prevented from increasing, and the light emitted by the light emitting elements can be efficiently used. In addition, according to the present invention, a flexible circuit board having a high electromagnetic shielding capability that can be bent and a vehicle lighting apparatus incorporating the same can be manufactured.

The present invention provides techniques advantageous for a flexible circuit board for mounting a light emitting element and a vehicle lighting apparatus incorporating the same, and a method of manufacturing the flexible circuit board. In particular, the present invention provides techniques advantageous for a flexible circuit board for mounting a light emitting element, such as an LED and a vehicle lighting apparatus incorporating the same, and a method of manufacturing the flexible circuit board.

What is claimed is:

1. A flexible circuit board for mounting a light emitting element, comprising:
    a base film having a substrate made of a metal and insulating protective films disposed on opposite sides of the substrate;
    a wiring pattern formed on a surface of said base film; and
    a cover film that has such a surface property as to produce specular reflection or diffuse reflection of light and covers said wiring pattern,
    wherein said cover film has a substrate comprising a metal material.

2. The flexible circuit board for mounting a light emitting element according to claim 1, wherein irregularities are formed on a surface of said cover film.

3. The flexible circuit board for mounting a light emitting element according to claim 1, wherein at least one of said substrate comprising a metal material of said base film and said substrate comprising a metal material of said cover film is electrically connected to a grounding wire in said wiring pattern.

4. The flexible circuit board for mounting a light emitting element according to claim 2, wherein said cover film further has a substantially white reflecting film formed on a surface of said substrate.

5. The flexible circuit board for mounting a light emitting element according to claim 2, wherein said irregularities on the surface are formed by depressions having a depth of 15 to 80 μm arranged in pitch of 100 to 3000 μm.

6. The flexible circuit board for mounting a light emitting element according to claim 3, wherein a through-hole is formed to penetrate said substrate comprising a metal material of said base film, said wiring pattern and said substrate comprising a metal material of said cover film and is filled with a conductive paste, and
    said substrate comprising a metal material of said base film and said substrate comprising a metal material of said cover film are electrically connected to said grounding wire by said conductive paste.

7. The flexible circuit board for mounting a light emitting element according to claim 3, wherein a through-hole is formed in at least one of said substrate comprising a metal material of said base film and said substrate comprising a metal material of said cover film and is filled with a conductive paste, and
    said substrate comprising a metal material of said base film and said substrate comprising a metal material of said cover film are electrically connected to said grounding wire by said conductive paste.

8. The flexible circuit board for mounting a light emitting element according to claim 6, wherein said cover film further has a substantially white reflecting film formed on a surface of said substrate, and
    said through-hole and said conductive paste filling said through-hole are covered with said reflecting film.

9. The flexible circuit board for mounting a light emitting element according to claim 7, wherein said cover film further has a substantially white reflecting film formed on a surface of said substrate, and
    said through-hole and said conductive paste filling said through-hole are covered with said reflecting film.

10. A flexible circuit board for mounting a light emitting element, comprising:
    a base film having a substrate comprising a resin material;
    a wiring pattern formed on a surface of said base film; and
    a cover film that has a substrate comprising a metal material, has such a surface property as to produce specular reflection or diffuse reflection of light and covers said wiring pattern,
    wherein irregularities are formed on a surface of said cover film.

11. The flexible circuit board for mounting a light emitting element according to claim 10, wherein said irregularities on the surface are formed by depressions having a depth of 15 to 80 μm arranged in pitch of 100 to 3000 μm.

12. The flexible circuit board for mounting a light emitting element according to claim 10, wherein a through-hole that reaches a grounding wire in said wiring pattern is formed in said substrate comprising a metal material of said cover film and is filled with a conductive paste, and
    said substrate comprising a metal material of said cover film is electrically connected to said grounding wire by said conductive paste.

13. An illumination apparatus, comprising:
    a flexible circuit board for mounting a light emitting element having a base film having a substrate made of a metal and insulating protective films disposed on opposite sides of the substrate, a wiring pattern formed on a surface of said base film, and a cover film that has such a surface property as to produce specular reflection or diffuse reflection of light and covers said wiring pattern; and
    a light emitting element mounted on said flexible circuit board for mounting a light emitting element,
    wherein said cover film has a substrate comprising a metal material.

14. An illumination apparatus, comprising:
    a flexible circuit board for mounting a light emitting element having a base film having a substrate made of a resin material, a wiring pattern formed on a surface of said base film, and a cover film that has a substrate made of a metal material, has such a surface property as to produce specular reflection or diffuse reflection of light and covers said wiring pattern; and
    a light emitting element mounted on said flexible circuit board for mounting a light emitting element.

15. A vehicle lighting apparatus, comprising:
    a flexible circuit board for mounting a light emitting element having a base film having a substrate made of a resin material, a wiring pattern formed on a surface of said base film, and a cover film that has a substrate made of a metal material, has such a surface property as to produce specular reflection or diffuse reflection of light and covers said wiring pattern; and
    a light emitting element mounted on said flexible circuit board for mounting a light emitting element.

\* \* \* \* \*